US011979999B2

(12) United States Patent
Shim et al.

(10) Patent No.: US 11,979,999 B2
(45) Date of Patent: May 7, 2024

(54) ELECTRONIC DEVICE INCLUDING FLEXIBLE DISPLAY

(71) Applicant: Samsung Electronics Co., Ltd., Suwon-si (KR)

(72) Inventors: Jongwan Shim, Suwon-si (KR); Bumhee Bae, Suwon-si (KR); Soohyun Seo, Suwon-si (KR); Minwoo Yoo, Suwon-si (KR); Byounguk Yoon, Suwon-si (KR); Sinhyung Jeon, Suwon-si (KR); Jongchul Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 247 days.

(21) Appl. No.: 17/563,591

(22) Filed: Dec. 28, 2021

(65) Prior Publication Data

US 2022/0183172 A1    Jun. 9, 2022

Related U.S. Application Data

(63) Continuation of application No. PCT/KR2021/018183, filed on Dec. 3, 2021.

(30) Foreign Application Priority Data

Dec. 4, 2020    (KR) .................. 10-2020-0168875

(51) Int. Cl.
*H05K 1/02* (2006.01)
*H01Q 1/24* (2006.01)
(Continued)

(52) U.S. Cl.
CPC .......... *H05K 5/0247* (2013.01); *H05K 5/0017* (2013.01); *H01Q 1/24* (2013.01);
(Continued)

(58) Field of Classification Search
CPC .......... H05K 1/02; H05K 1/028; H05K 1/111; H05K 1/147; H05K 1/189; H05K 5/0017;
(Continued)

(56) References Cited

U.S. PATENT DOCUMENTS

10,537,026 B2 * 1/2020 Shin ............... H05K 5/0017
10,547,718 B2 * 1/2020 Lee ................ G06F 1/1652
(Continued)

FOREIGN PATENT DOCUMENTS

CN          111385393 B    5/2021
KR    10-2016-0047651 A    5/2016
(Continued)

OTHER PUBLICATIONS

International Search Report and Written Opinion dated Mar. 3, 2022, issued in International Patent Application No. PCT/KR2021/018183.

*Primary Examiner* — Xiaoliang Chen
(74) *Attorney, Agent, or Firm* — Jefferson IP Law, LLP

(57) ABSTRACT

An electronic device is provided. The electronic device comprises a housing, a flexible display configured to be at least partially rolled around a rotation axis in a substantially circular shape in an internal space of the housing, a battery located in the internal space in which the flexible display is rolled, a first printed circuit board located on one surface of the battery that is oriented in a direction of the rotation axis, the first printed circuit board being electrically connected to the flexible display and including a first wireless communication circuitry, and a second printed circuit board located inside the housing to face the first printed circuit board and including a second wireless communication circuitry. The first printed circuit board may be configured to be rotatable about the rotation axis in a state of being electrically connected to the second printed circuit board.

18 Claims, 22 Drawing Sheets

(51) Int. Cl.
*H05K 5/00* (2006.01)
*H05K 5/02* (2006.01)
*H01R 39/64* (2006.01)
*H02J 7/00* (2006.01)
*H05K 1/14* (2006.01)
*H05K 1/18* (2006.01)

(52) U.S. Cl.
CPC ........... *H01R 39/643* (2013.01); *H02J 7/0063* (2013.01); *H05K 1/147* (2013.01); *H05K 1/189* (2013.01); *H05K 5/0086* (2013.01); *H05K 5/0217* (2013.01); *H05K 2201/10128* (2013.01)

(58) Field of Classification Search
CPC .. H05K 5/0086; H05K 5/0217; H05K 5/0247; H05K 5/023; H05K 5/028; H05K 5/1427; H05K 2201/10128; G06F 1/1605; G06F 1/1607; G06F 1/1618; G06F 1/1624; G06F 1/1626; G06F 1/1652; G06F 1/1656; G06F 1/1658; G06F 1/1677; G06F 1/1681; G06F 2203/04102; H01Q 1/24; H01R 39/643; H02J 7/0063

USPC ................................ 361/749, 678.27; 29/829
See application file for complete search history.

(56) References Cited

U.S. PATENT DOCUMENTS

| | | | |
|---|---|---|---|
| 10,591,958 | B2 | 3/2020 | Kim et al. |
| 11,343,365 | B2* | 5/2022 | Zuo ........................ G06F 1/1677 |
| 11,470,729 | B2* | 10/2022 | Kim .................... H04M 1/0237 |
| 2015/0116921 | A1 | 4/2015 | Hsu et al. |
| 2016/0120023 | A1 | 4/2016 | Choi et al. |
| 2017/0212607 | A1* | 7/2017 | Yoon ........................ G06F 3/147 |
| 2018/0210559 | A1* | 7/2018 | Xia ................... H04M 1/72409 |
| 2020/0234616 | A1* | 7/2020 | Ha ...................... H04M 1/0268 |

FOREIGN PATENT DOCUMENTS

| | | |
|---|---|---|
| KR | 10-2017-0006089 A | 1/2017 |
| KR | 10-2017-0050270 A | 5/2017 |
| KR | 10-2017-0089664 A | 8/2017 |
| KR | 10-1792692 B1 | 10/2017 |
| KR | 10-2019-0098310 A | 8/2019 |
| KR | 10-2104731 B1 | 5/2020 |
| WO | 2017-119543 A1 | 7/2017 |

* cited by examiner

000# ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/KR2021/018183, filed on Dec. 3, 2021, which is based on and claims the benefit of a Korean patent application number 10-2020-0168875, filed on Dec. 4, 2020, in the Korean Intellectual Property Office, the disclosure of which is incorporated by reference herein in its entirety.

TECHNICAL FIELD

The disclosure relates to an electronic device including a flexible display.

BACKGROUND ART

With the development of digital technologies, electronic devices are being provided in various forms, such as a smartphone, a tablet personal computer (PC), and a personal digital assistant (PDA). Electronic devices are being designed to provide a larger screen while having a portable size that does not cause inconvenience to users when handling the electronic devices by hand. For example, the electronic device may include a flexible display, and a portion of the flexible display may be pulled out from an internal space of the electronic device, and thus the screen may be expanded.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

An electronic device in which a screen is expanded by pulling out a flexible display to the outside may include an electrical connection member (e.g., a flexible printed circuit board, or a cable) that electrically connects an electrical element included in a portion that moves in response to a movement of the flexible display to an electrical element included in a portion that does not move in response to a movement of the flexible display. In a screen expansion operation or a screen contraction operation of the electronic device, there may be a twisting phenomenon of the electrical connection member. The electrical connection member may be flexible, but may be damaged due to the twisting phenomenon.

Aspects of the disclosure are to address at least the above-mentioned problems and/or disadvantages and to provide at least the advantages described below. Accordingly, an aspect of the disclosure is to provide an electronic device including a flexible display having an electric conduction structure stable in a screen expansion operation or a screen contraction operation instead of an electrical connection member such as a flexible printed circuit board.

The technical problems to be addressed by this disclosure are not limited to those described above, and other technical problems, which are not described above, may be clearly understood by a person ordinarily skilled in the related art to which this disclosure belongs.

Additional aspects will be set forth in part in the description which follows and, in part, will be apparent from the description, or may be learned by practice of the presented embodiments.

Solution to Problem

In accordance with an aspect of the disclosure, an electronic is provided. The electronic device includes a housing, a flexible display configured to be at least partially rolled around a rotation axis in a substantially circular shape in an internal space of the housing, a battery located in a space in which the flexible display is rolled, a first printed circuit board located on one surface of the battery that is oriented in a direction of the rotation axis, the first printed circuit board being electrically connected to the flexible display and including a first wireless communication circuitry, and a second printed circuit board located inside the housing to face the first printed circuit board and including a second wireless communication circuitry. The first printed circuit board may be configured to be rotatable about the rotation axis in a state of being electrically connected to the second printed circuit board.

Advantageous Effects of Invention

In an electronic device including a flexible display according to various embodiments of the disclosure, it is possible to provide an electric conduction structure stable in a screen expansion operation or a screen contraction operation instead of an electric connection member such as a flexible printed circuit board. Therefore, it is possible to improve reliability of an electronic device including an expandable screen.

In addition, effects that can be obtained or predicted by various embodiments of the disclosure may be directly or implicitly disclosed in the detailed description of the embodiments of the disclosure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
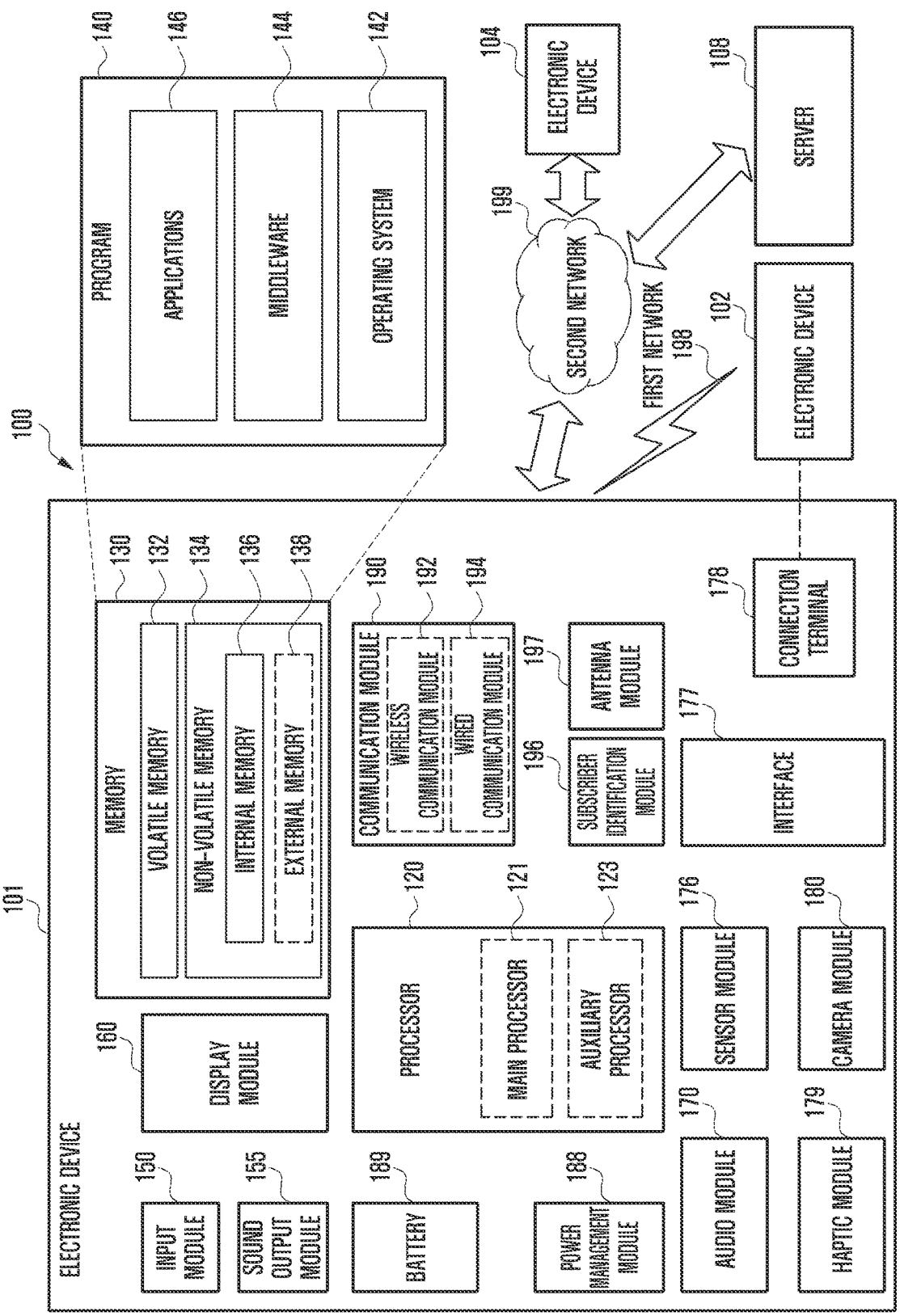
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identity module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, an auxiliary processor 123 (e.g., a neural network processing device) may include a hardware structure specialized for processing an artificial intelligence model. The artificial intelligence model may be created through machine learning. Such learning may be performed, for example, in the electronic device 101 itself on which artificial intelligence model is performed, or may be performed through a separate server (e.g., the server 108). The learning algorithm may include, for example, supervised learning, unsupervised learning, semi-supervised learning, or reinforcement learning, but is not limited thereto. The artificial intelligence model may include a plurality of artificial neural network layers. An artificial neural network may be any of a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-networks, or a combination of two or more of the above-mentioned networks, but is not limited to the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connection terminal 178 may include a connector via which the electronic device 101 may be physically connected with the external electronic device (e.g., the electronic device 102). The connection terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR Data Association (IrDA)) or the second network 199 (e.g., a long-range communication network, such as a legacy cellular network, 5th generation (5G) network, a next generation network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4th generation (4G) network and a next-generation communication technology, such as a new radio (NR) access technology. The NR access technology may support high-speed transmission of high-capacity data (i.e., an enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) in order to achieve, for example, a high data transmission rate. The wireless communication module 192 may support various technologies for securing performance in a high-frequency band, such as beamforming, massive multiple-input and multiple-output (MIMO), and full-dimensional multiple-input and multiple-output (FD-MIMO), an array antenna, analog beam-forming, or a large-scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate for realizing eMBB (e.g., 20 Gbps or more), loss coverage for realizing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a PCB). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, a mobile edge computing (MEC), or client-server computing technology may be used, for example. The electronic device 101 may provide an ultra-low delay service using, for example, distributed computing or MEC. In another embodiment of the disclosure, the external electronic device 104 may include an Internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on a 5G communication technology and an IoT-related technology.

An electronic device according to an embodiment of the disclosure may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
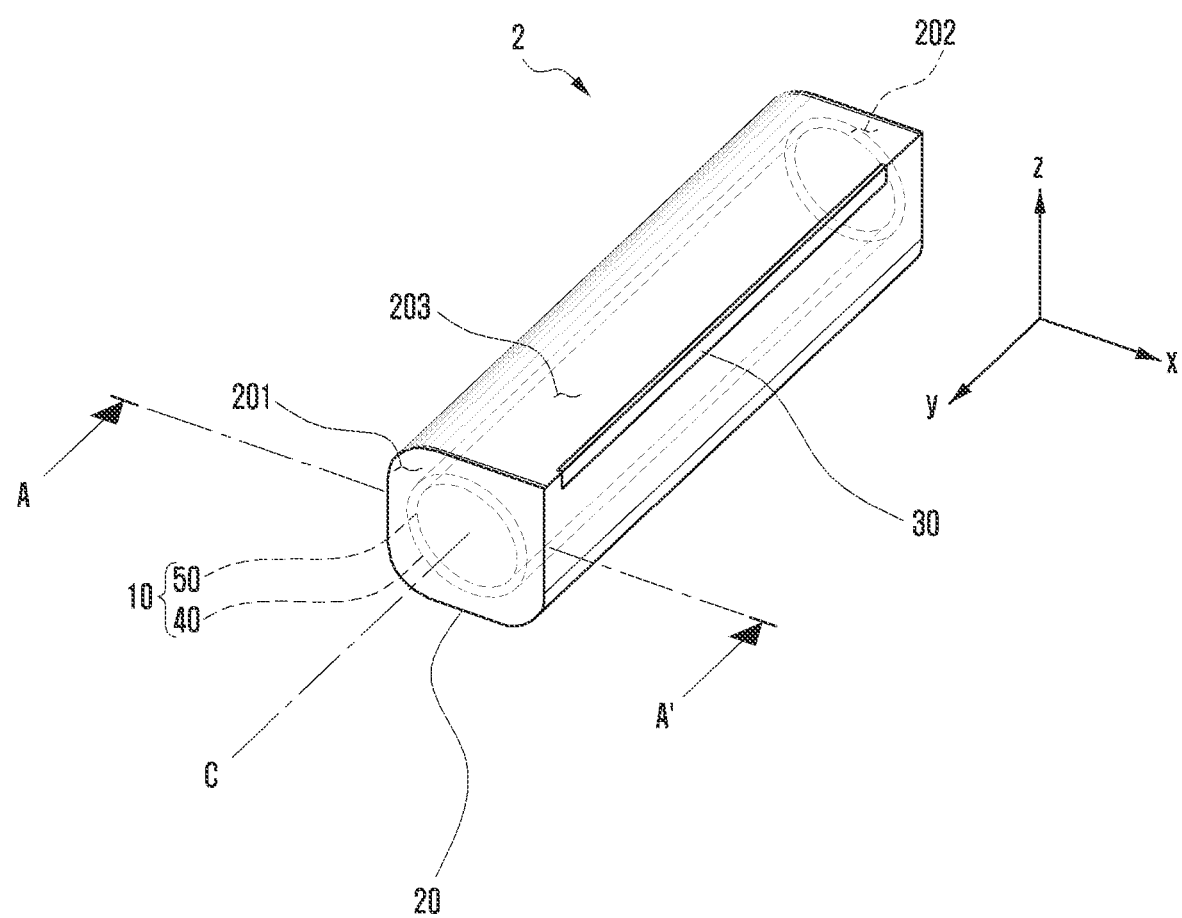
FIG. 2 is a perspective view of an electronic device in a closed state according to an embodiment of the disclosure.

FIG. 2 is a perspective view of an electronic device 2 in a closed state according to an embodiment of the disclosure.

Figure 3:
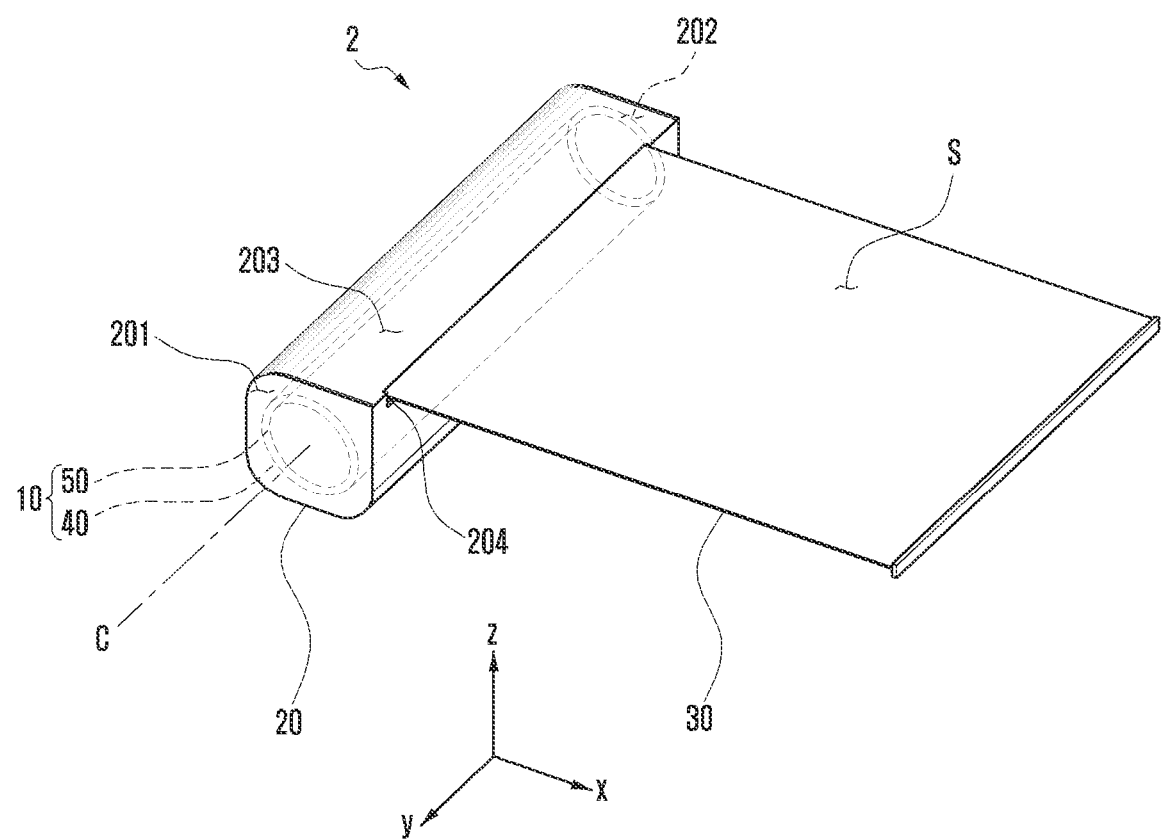
FIG. 3 is a perspective view of an electronic device in an open state according to an embodiment of the disclosure.

FIG. 3 is a perspective view of the electronic device 2 in an open state according to an embodiment of the disclosure.

Referring to FIGS. 2 and 3, an electronic device 2 (e.g., an electronic device 101 in FIG. 1) may include a housing (or a housing structure) 20, a flexible display 30, a cylindrical roller 40, and/or a battery 50.

According to an embodiment, at least a portion of the flexible display 30 may be accommodated in the internal space of the housing 20 in a state of being rolled in a circular shape. The flexible display 30 may be referred to as, for example, a rollable display. The closed state of the electronic device 2 illustrated in FIG. 2 is, for example, the state in which the flexible display 30 is maximally moved such that the flexible display 30 is not introduced into the internal space of the housing 20 anymore, and may be referred to as a state in which a screen (e.g., a display area or an active area) visible to the outside is contracted. In an embodiment, the screen visible to the outside in the closed state of the electronic device 2 may not be substantially provided. In some embodiments, the electronic device 2 may be implemented such that the screen visible to the outside is provided in the state in which the electronic device 2 is closed. The open state of the electronic device 2 illustrated in FIG. 3 is, for example, the state in which the flexible display 30 is maximally moved such that the flexible display 30 is not pulled out of the housing 20 anymore, and may be referred to as the state in which the screen S is expanded. Although not illustrated, the electronic device 2 may be in an intermediate state between the closed state in FIG. 2 and the open state in FIG. 3.

At least a portion of the flexible display 30 may be introduced into the internal space of the housing 20 while being rolled in a circle around, for example, the rotation axis C. In an embodiment, the housing 20 may include a first surface 201 and a second surface 202 located apart from each other in a direction in which the rotation axis C extends (e.g., the y-axis direction). The first surface 201 may be oriented in a first direction (e.g., the +y-axis direction), and the second surface 202 may be oriented in a second direction (e.g., the −y-axis direction) opposite to the first direction. The housing 20 may include a third surface 203 (e.g., a lateral surface or a side surface) that surrounds the space between the first surface 201 and the second surface 202. The housing 20 may include an opening 204 located in the third surface 203, and the flexible display 30 may be introduced into the interior space of the housing 20 through the opening 204 or may be pulled out to the outside of the housing 20. In some embodiments, the housing 20 may refer to a structure defining at least a portion of the first surface 201, the second surface 202, and the third surface 203.

According to an embodiment, the cylindrical roller 40 may be located inside the housing 20 to be rotatable about the rotation axis C. During the state change of the electronic device 2 (e.g., switching between the closed state and the open state), there may be switching between a movement of the flexible display 30 and a rotational motion of the cylindrical roller 40. For example, when the electronic device 2 is switched from the open state to the closed state, at least a portion of the flexible display 30 may be introduced into the internal space of the housing 20 while being rolled around the cylindrical outer surface of the cylindrical roller 40 rotating about the rotation axis C.

In an embodiment, referring to the closed state in FIG. 2, the battery 50 may be located in the internal space in which the flexible display 30 is rolled. The cylindrical roller 40 may include a cylindrical outer surface on which the flexible display 30 may be positioned in a rolled state, and a cylindrical inner surface located opposite to the cylindrical outer surface. The cylindrical roller 40 may include, for example, a hollow extending from a first opening at one side to a second opening at the other side. In some embodiments, the electronic device 2 or the cylindrical roller 40 may further include a cover (or a cover member) configured to at least partially cover the first opening or the second opening. The cylindrical outer surface of the cylindrical roller 40 may be a circular outer peripheral surface (e.g., a cylindrical surface) spaced apart from the rotation axis C by a corresponding radius. The battery 50 may be located in the internal space (e.g., the hollow) of the cylindrical roller 40 which is a space defined by the cylindrical inner surface of the cylindrical roller 40. In some embodiments, the cylindrical roller 40 may be referred to by various other terms, such as a hollow cylinder or a cylindrical shell. The cylindrical inner surface may have a shape corresponding to the internal space of the cylindrical roller 40 in which the battery 50 is accommodated. For example, the battery 50 may have a cylindrical shape, and the cylindrical inner surface of the cylindrical roller 40 may be parallel to the cylindrical outer surface of the battery 50 or the cylindrical outer surface of the cylindrical roller 40. The cylindrical inner surface of the cylindrical roller 40 is not limited to a circular surface, and may be provided in various other shapes capable of supporting the battery 50.

According to an embodiment, during the state change of the electronic device 2 (e.g., switching between the closed state in FIG. 2 and the open state in FIG. 3), the battery 50 may be rotated together with the cylindrical roller 40. For example, the battery 50 may be fitted into the internal space of the cylindrical roller 40, and a rotating body 10 including the cylindrical roller 40 and the battery 50 may be provided. As another example, an adhesive material may be located between the battery 50 and the cylindrical roller 40, and a rotating body 10 including the cylindrical roller 40 and the battery 50 may be provided. In an embodiment, the rotating body 10 including the cylindrical roller 40 and the battery 50 may be implemented by balancing the weight about the rotation axis C. This makes it possible to suppress occurrence of vibration of the electronic device 2 when the rotating body 10 including the cylindrical roller 40 and the battery 50 is rotated about the rotation axis C during the state change (e.g., switching between the closed state and the open state) of the electronic device 2.

Figure 4:
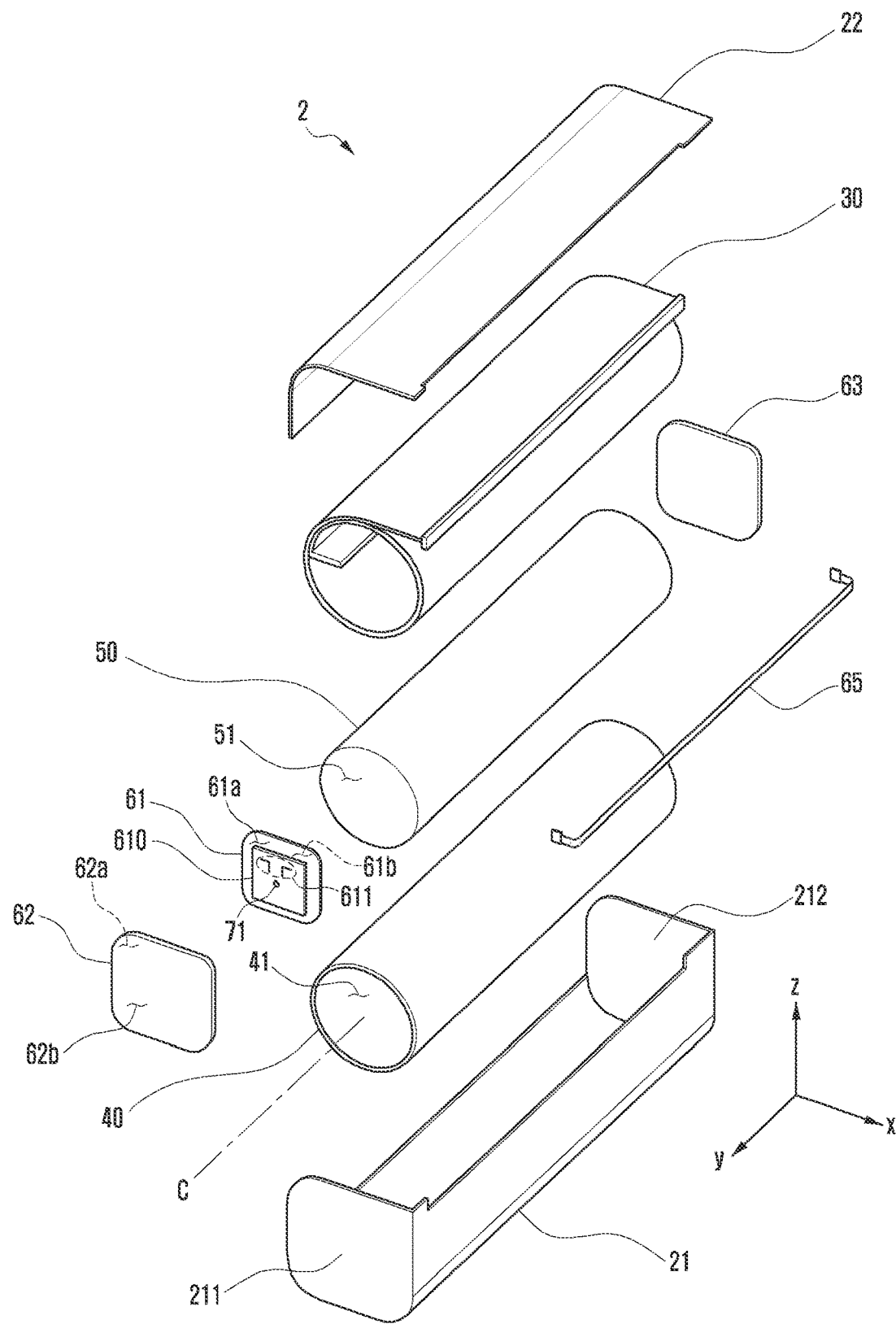
FIG. 4 is an exploded view of the electronic device of FIG. 2 according to an embodiment of the disclosure.

FIG. 4 is an exploded perspective view of an electronic device of FIG. 2 according to an embodiment of the disclosure.

Figure 5:
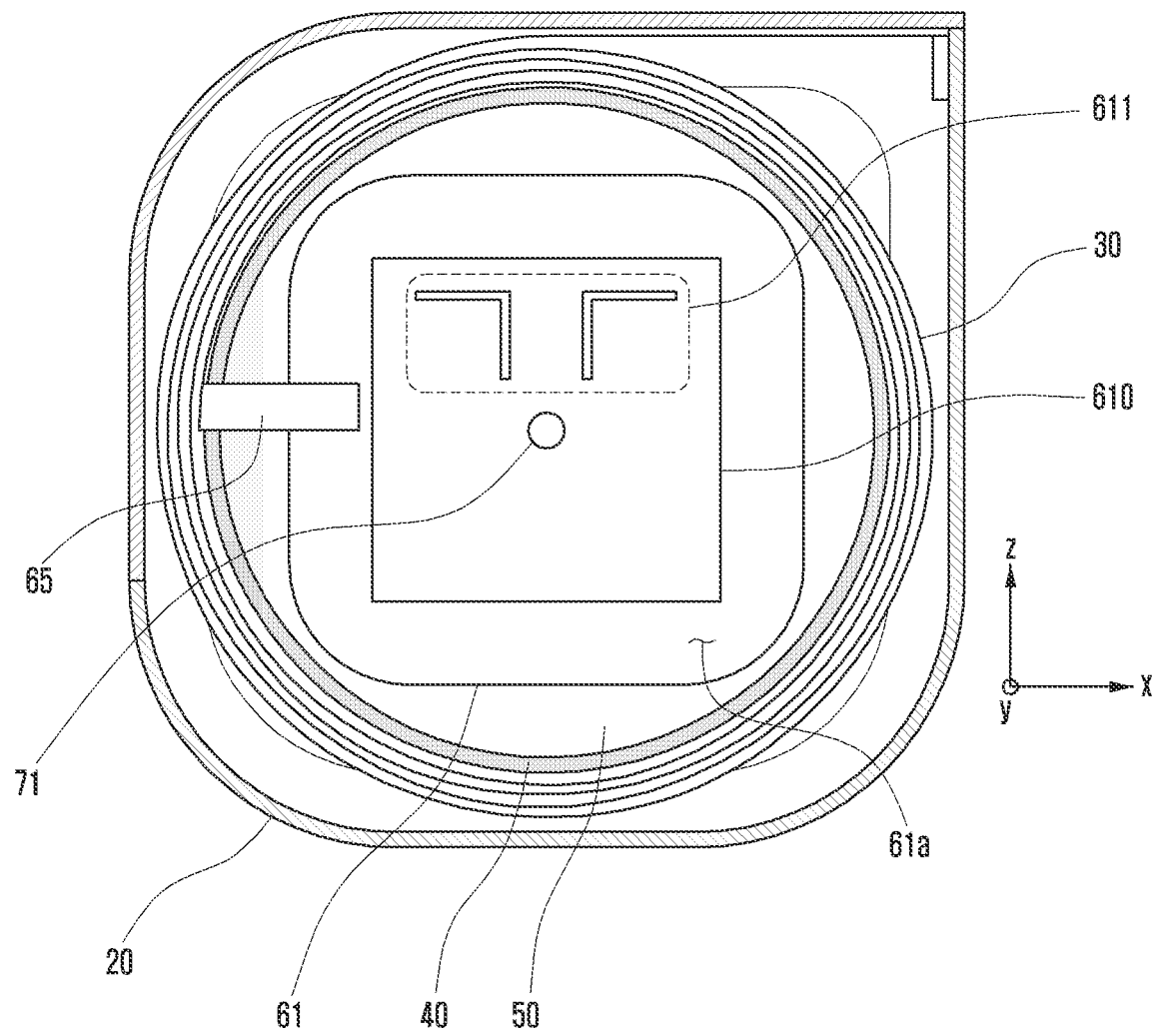
FIG. 5 is, for example, a partial cross-sectional view in the x-z plane of the electronic device, taken along line A-A' in FIG. 2 according to an embodiment of the disclosure.

FIG. 5 is, for example, a partial cross-sectional view in an x-z plane of an electronic device, taken along line A-A' in FIG. 2 according to an embodiment of the disclosure.

Figure 6:
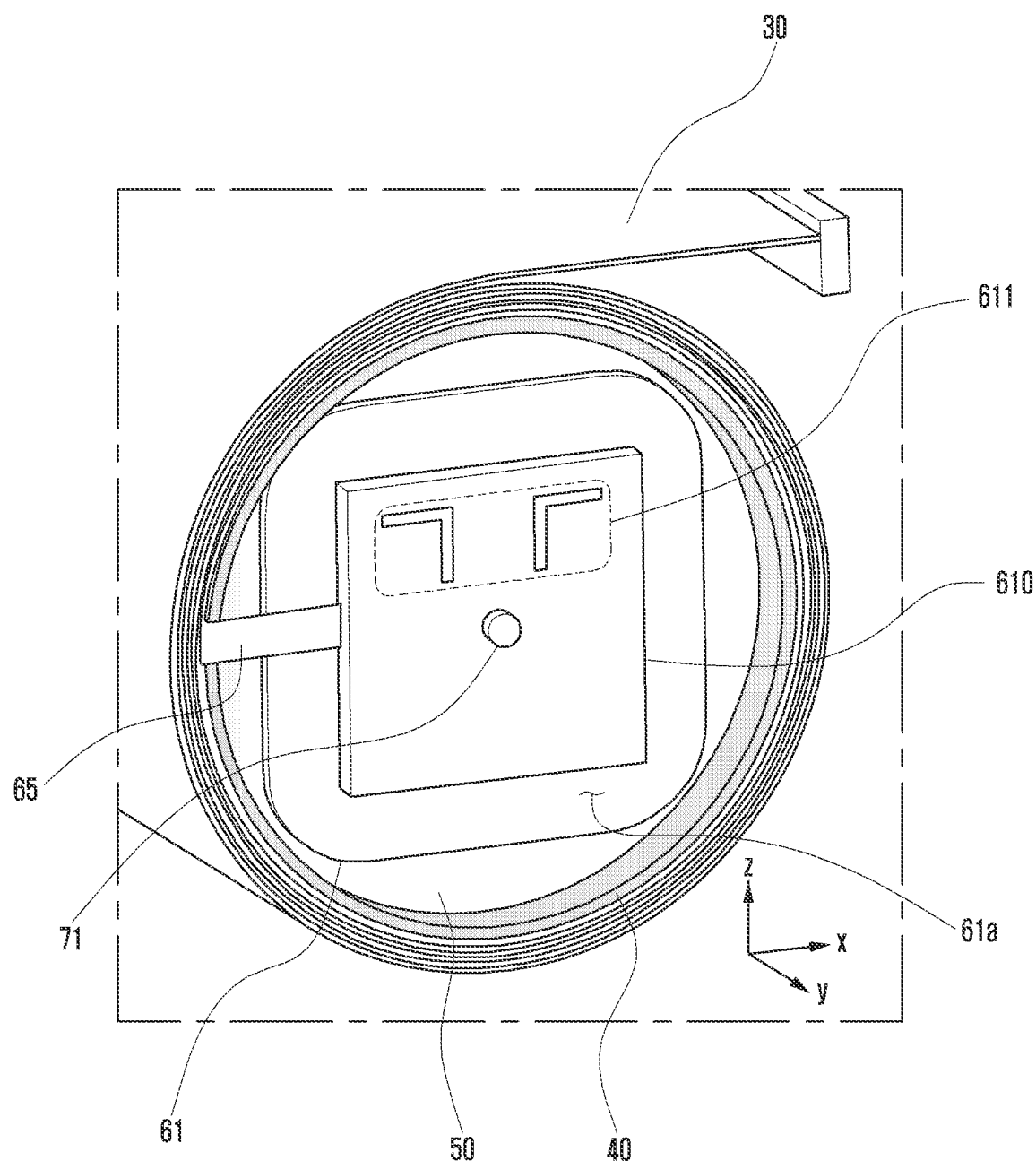
FIG. 6 illustrates a flexible display, a cylindrical roller, a battery, and a first printed circuit board in a state in which an electronic device is closed according to an embodiment of the disclosure.

FIG. 6 illustrates a flexible display, a cylindrical roller, a battery, and a first printed circuit board in a state in which an electronic device is closed according to an embodiment of the disclosure.

Figure 7:
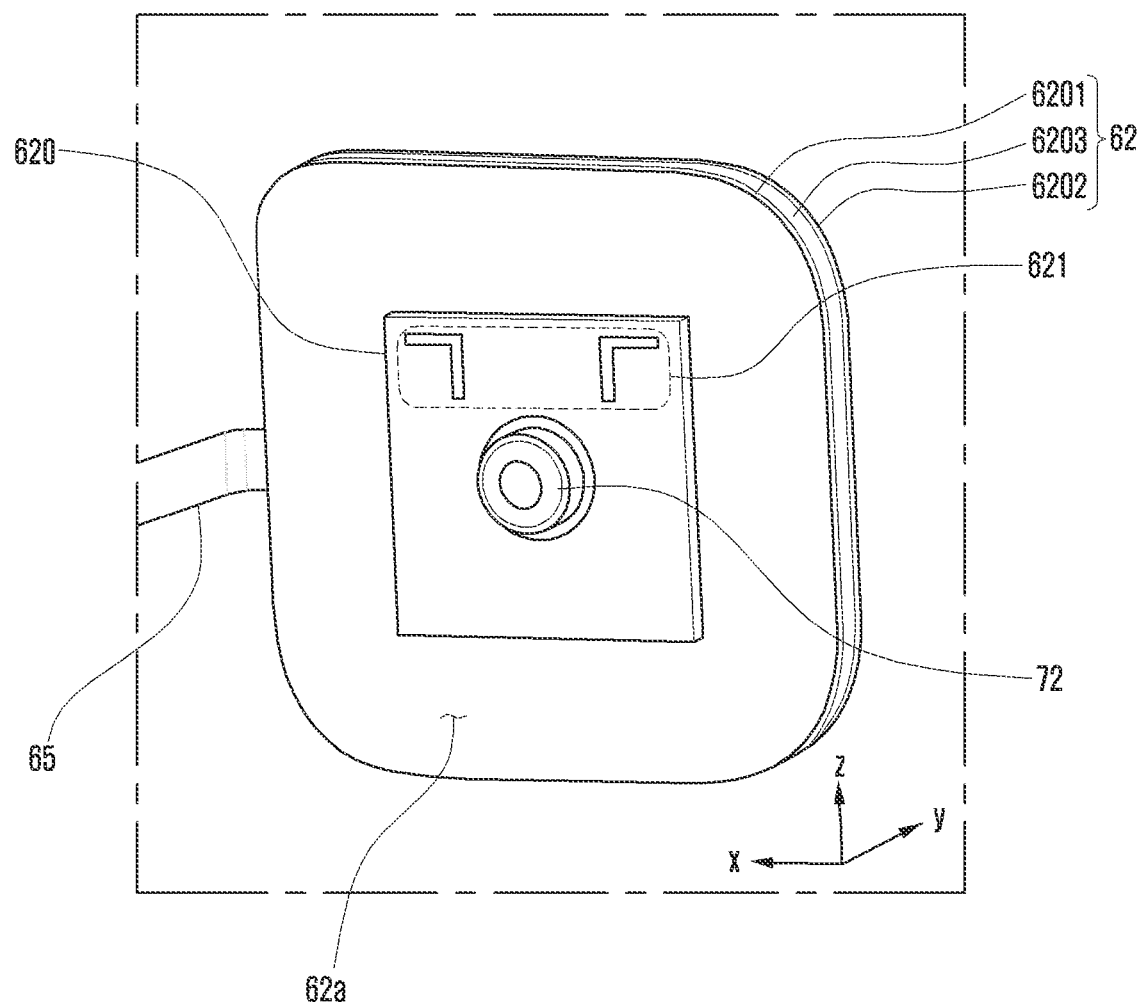
FIG. 7 illustrates a second printed circuit board and an electrical path according to an embodiment of the disclosure.

FIG. 7 illustrates a second printed circuit board and an electrical path according to an embodiment of the disclosure.

Figure 8:
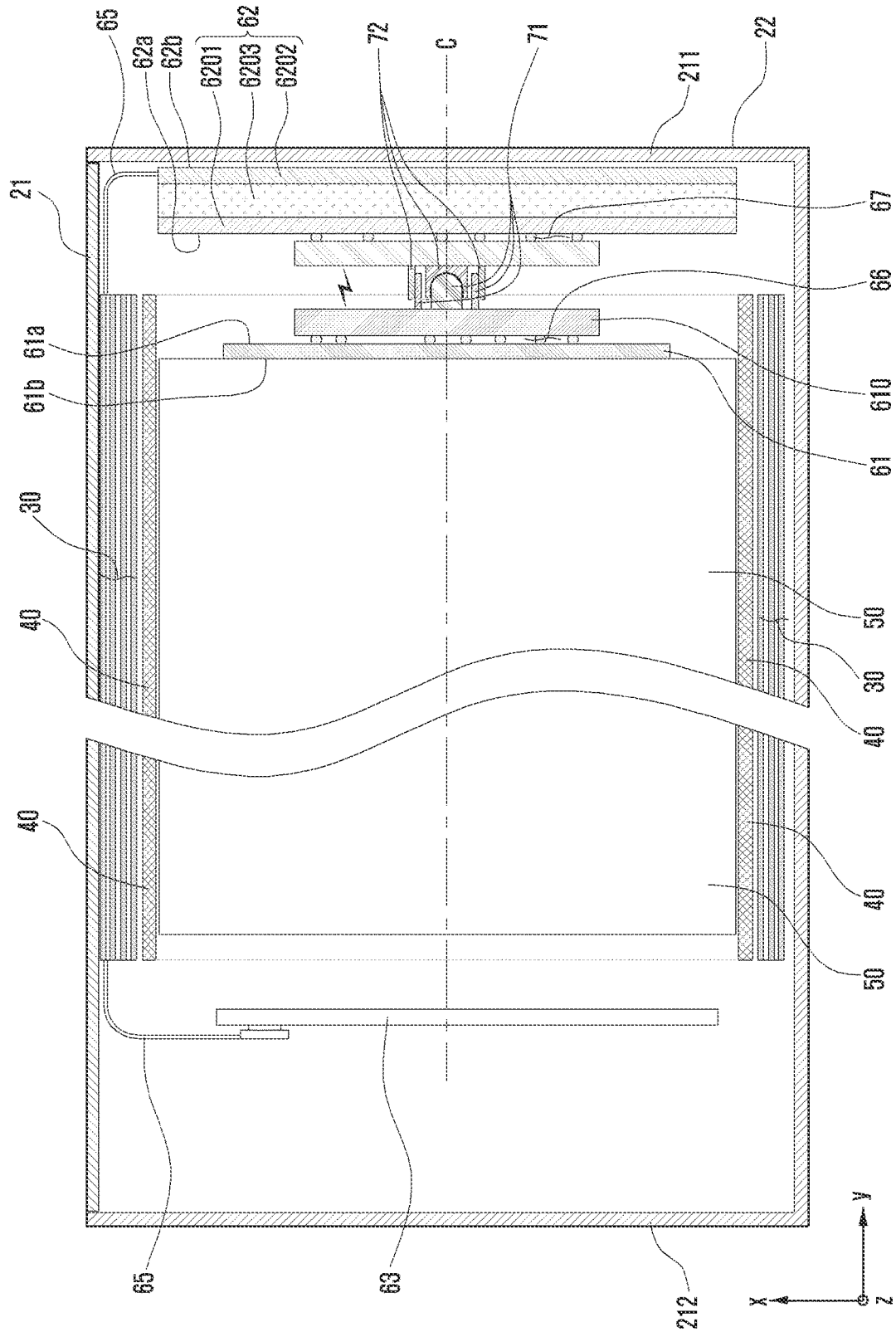
FIG. 8 is, for example, a partial cross-sectional view in an x-y plane of an electronic device taken along a rotation axis in FIG. 2 according to an embodiment of the disclosure.

FIG. 8 is, for example, a partial cross-sectional view in the x-y plane of the electronic device taken along a rotation axis C in FIG. 2 according to an embodiment of the disclosure.

Referring to FIGS. 4 and 8, an electronic device 2 may include a first housing unit 21, a second housing unit 22, a flexible display 30, a cylindrical roller 40, a battery 50, and a first printed circuit board 61, a second printed circuit board 62, a third printed circuit board 63, and/or an electrical path 65.

The housing 20 of FIG. 2 may include, for example, the first housing unit 21 and the second housing unit 22. The housing 20 is not limited to the example of FIG. 4 and may include various types or numbers of housing units. In an embodiment, the first housing unit 21 may include a first cover 211 defining the first surface 201 in FIG. 2 or 3 and a second cover 212 defining the second surface 202 of FIG. 2 or 3. The first cover 211 and the second cover 212 may be spaced apart from each other in the direction in which the rotation axis C of the cylindrical roller 40 extends.

According to an embodiment, the electronic device 2 may include a drive module (not illustrated) associated with the rotation of the cylindrical roller 40 or the movement of the flexible display 30. The drive module may rotate, for example, the cylindrical roller 40 to contribute to the movement of the flexible display 30. As another example, the drive module may move the flexible display 30, whereby the cylindrical roller 40 may be rotated. In an embodiment, the drive module may include an elastic structure configured to apply elasticity to the cylindrical roller 40 to rotate the cylindrical roller 40 or to move the flexible display 30. For example, the elastic structure included in the drive module may cause a state change (e.g., switching between the closed state in FIG. 2 and the open state in FIG. 3) of the electronic device 2 without an electrical drive device such as a motor.

According to some embodiments, the drive module may include an electrical drive device such as a motor. For example, when a signal (e.g., a signal generated through a hardware button or a software button provided through a screen) is generated through an input device included in the electronic device 2, the electronic device 2 may be switched from the closed state to the open state or from the open state to the closed state due to a drive device such as a motor. According to some embodiments, when a signal is generated from various sensors such as a pressure sensor, the electronic device 2 may be switched from the closed state to the open state or from the open state to the closed state.

According to an embodiment, the first printed circuit board 61 may be located between the battery 50 (or the cylindrical roller 40) and the first cover 211. The first printed circuit board 61 may be disposed on a surface 51 of the battery 50 that faces the first cover 211. For example, various polymer adhesive materials may be positioned between the battery 50 and the first printed circuit board 61. In some embodiments, the cylindrical roller 40 may include a cover member that at least partially covers the first opening 41 located at the first cover 211 side. In this case, the first printed circuit board 61 may be disposed on the cover member using an adhesive material or fastening means such as a bolt. The first printed circuit board 61 may include, for example, a printed circuit board (PCB), a flexible PCB (FPCB), or a rigid-flexible PCB (RFPCB).

According to an embodiment, the second printed circuit board 62 may be located between the first cover 211 and the first printed circuit board 61. For example, various polymer adhesive materials may be located between the second printed circuit board 62 and the first cover 211. As another example, the second printed circuit board 62 may be disposed on the first cover 211 using various fastening means such as a bolt. The first printed circuit board 61 may include, for example, a third surface 61a facing the second printed circuit board 62, and a fourth surface 61b facing one surface 51 of the battery 50. The second printed circuit board 62 may include, for example, a fifth surface 62a facing the first printed circuit board 61, and a sixth surface 62b facing the first cover 211. The second printed circuit board 62 may include, for example, a PCB, an FPCB, or an RFPCB.

Referring to FIGS. 4, 5, 6, and 8, a first printed circuit board 61 may include a first wireless communication module (or a first wireless communication circuitry) 610 located on a third surface 61a. The first wireless communication module 610 may include, for example, an integrated circuit (IC) in the form of a chip. A conductive bonding material (e.g., solder) 66 may be located between the first wireless communication module 610 and the third surface 61a of the first printed circuit board 61, and the first wireless communication module 610 may be electrically connected to a circuit (e.g., a circuit pattern or wiring) included in the first printed circuit board 61. The first wireless communication module 610 may include at least one first antenna radiator 611 and a first wireless communication circuit (not illustrated) electrically connected to the at least one first antenna radiator 611. The at least one first antenna radiator 611 may form an electromagnetic field capable of transmitting and/or receiving a signal of at least one frequency in a selected or predetermined frequency band when radiation current is provided from the first wireless communication circuit. The first wireless communication circuit may process a transmission signal or a reception signal in at least one predetermined frequency band via the at least one first antenna radiator 611. In various embodiments, the first wireless communication circuit may include at least a portion of the wireless communication module 192 included in the electronic device 101 of FIG. 1. In some embodiments, the at least one first antenna radiator 611 may be located on the third surface 61a of the first printed circuit board 61 or inside the first printed circuit board 61 to be closer to the third surface 61a than the fourth surface 61b.

The first wireless communication module 610 may include, for example, a case (or a housing) in the form of a chip and a printed circuit board located inside the case and including a first wireless communication circuit. In an embodiment, the at least one first antenna radiator 611 may include a conductive pattern located in a case. For example, the at least one first antenna radiator 611 may be implemented in various ways such as laser direct structuring (LDS), plating, or printing. In some embodiments, the at least one first antenna radiator 611 may be located on the printed circuit board located inside the case (e.g., a microstrip such as a patch antenna or a dipole antenna).

According to some embodiments, the first printed circuit board 61 or the first wireless communication module 610 may include a frequency adjustment circuit connected to a transmission line between the at least one first antenna radiator 611 and the first wireless communication circuit. The frequency adjustment circuit may include an electrical element having a component such as inductance, capacitance, or conductance acting on the transmission line. The frequency adjustment circuit may include various elements such as a lumped element or a passive element. In an embodiment, the frequency adjustment circuit may include a matching circuit. The matching circuit may adjust the impedance of the transmission line or the impedance of the at least one first antenna radiator 611. The matching circuit may match the impedance of the transmission line and the impedance of the at least one first antenna radiator 611. The matching circuit may, for example, reduce reflection at a selected or predetermined frequency (or an operating frequency), reduce power loss via the at least one first antenna radiator 611 at the selected or predetermined frequency, or enable efficient signal transmission. In some embodiments, the frequency adjustment circuit may shift the resonant frequency of the at least one first antenna radiator 611 to a predetermined frequency, or may shift the resonant frequency by a predetermined amount.

Referring to FIGS. 4, 7, and 8, a second printed circuit board 62 may include a second wireless communication module (or a second wireless communication circuitry) 620 located on a fifth surface 62a. The second wireless communication module 620 may include, for example, an IC in the form of a chip. A conductive bonding material (e.g., solder) 67 may be located between the second wireless communication module 620 and the fifth surface 62a of the second printed circuit board 62, and the second wireless communication module 620 may be electrically connected to a circuit (e.g., a circuit pattern or wiring) included in the second printed circuit board 62. The second wireless communication module 620 may include at least one second antenna radiator 621 and a second wireless communication circuit (not illustrated) electrically connected to the at least one second antenna radiator 621. The at least one second antenna radiator 621 may form an electromagnetic field capable of transmitting and/or receiving a signal of at least one frequency in a selected or predetermined frequency band when radiation current is provided from the second wireless communication circuit. The second wireless communication circuit may process a transmission signal or a reception signal in at least one predetermined frequency band via the at least one second antenna radiator 621. In various embodiments, the second wireless communication circuit may include at least a portion of the wireless communication module 192 included in the electronic device 101 of FIG. 1. In some embodiments, the at least one second antenna radiator 621 may be located on the fifth surface 62a of the second printed circuit board 62 or inside the second printed circuit board 62 to be closer to the fifth surface 62a than the sixth surface 62b.

The second wireless communication module 620 may include, for example, a case (or a housing) in the form of a chip and a printed circuit board located inside the case and including a second wireless communication circuit. In an embodiment, the at least one second antenna radiator 621 may include a conductive pattern located in a case. For example, the at least one second antenna radiator 621 may be implemented in various ways such as LDS, plating, or printing. In some embodiments, the at least one second antenna radiator 621 may be located on the printed circuit board located inside the case (e.g., a microstrip such as a patch antenna or a dipole antenna).

According to some embodiments, the second printed circuit board 62 or the second wireless communication module 620 may include a frequency adjustment circuit connected to a transmission line between the at least one second antenna radiator 621 and the second wireless communication circuit. The frequency adjustment circuit may include an electrical element having a component such as inductance, capacitance, or conductance acting on the transmission line. The frequency adjustment circuit may include various elements such as a lumped element or a passive element. In an embodiment, the frequency adjustment circuit may include a matching circuit. The matching circuit may adjust the impedance of the transmission line or the impedance of the at least one second antenna radiator 621. The matching circuit may match the impedance of the transmission line and the impedance of the at least one second antenna radiator 621. The matching circuit may, for example, reduce reflection at a selected or predetermined frequency (or an operating frequency), reduce power loss via the at least one second antenna radiator 621 at the selected or predetermined frequency, or enable efficient signal transmission. In some embodiments, the frequency adjustment circuit may shift the resonant frequency of the at least one second antenna radiator 621 to a predetermined frequency, or may shift the resonant frequency by a predetermined amount.

According to an embodiment, the first wireless communication module 610 and the second wireless communication module 620 may send and receive signals in a predetermined frequency band. The predetermined frequency band may include, for example, at least one of a low band (LB) (about 600 MHz to about 1 GHz), a middle band (MB) (about 1 GHz to about 2.3 GHz), a high band (HB) (about 2.3 GHz to about 2.7 GHz), or an ultra-high band (UHB) (about 2.7 GHz to about 6 GHz). The predetermined frequency band may include other frequency bands.

According to an embodiment, the first wireless communication module 610 and the second wireless communication module 620 may implement short-range wireless communication (e.g., short-range communication (e.g., Bluetooth, wireless fidelity (Wi-Fi) direct, or infrared data association (IrDA)) network.

According to an embodiment, the first printed circuit board 61 may be electrically connected to the flexible display 30. For example, the first printed circuit board 61 and the flexible display 30 may be electrically connected to each other via an electrical path such as a flexible printed circuit board. The flexible display 30 may include a display drive circuit. The display drive circuit is a circuit for controlling the flexible display 30, and may include, for example, a display drive integrated circuit (DDI) or a DDI chip. A signal commanded by a processor (e.g., the processor 120 in FIG. 1) disposed on the second printed circuit board 62 may be transmitted to the display drive circuit through wireless communication between the first wireless communication module 610 and the second wireless communication module 620.

According to some embodiments, the flexible display 30 may include a touch detection circuit (or a touch sensor). The first printed circuit board 61 may include a sensor IC (e.g., a touch controller integrated circuit (IC)) electrically connected to the touch detection circuit. The sensor IC may convert an analog signal acquired via the touch detection circuit into a digital signal. The sensor IC may generate an electrical signal regarding coordinates on the screen with a valid touch input or hovering input on the screen. The electrical signal regarding the coordinates on the screen may be transmitted to the processor (e.g., the processor 120 in FIG. 1) through wireless communication between the first wireless communication module 610 and the second wireless communication module 620. The processor may recognize the coordinates on the screen based on the electrical signal received from the sensor IC.

According to an embodiment, the first printed circuit board 61 may be electrically connected to the battery 50. The battery 50 is a device for supplying power to at least one component of the electronic device 2, and may include, for example, a non-rechargeable primary battery, a rechargeable secondary battery, or a fuel cell. The battery 50 may be integrally disposed inside the cylindrical roller 40, or may be detachably disposed on the electronic device 2.

According to an embodiment, in a change in state of the electronic device 2 (e.g., switching between the closed state in FIG. 2 and the open state in FIG. 3), the first printed circuit board 61 may be rotatable about the rotation axis C in the state of being electrically connected to the second printed circuit board 62. The first printed circuit board 61 may include a first terminal unit (or a first terminal circuitry) 71, and the second printed circuit board 62 may include a second terminal unit (or a second terminal circuitry) 72. The first terminal unit 71 and the second terminal unit 72 may be in physical contact to conduct electricity with each other. For example, during the state change of the electronic device 2, the first terminal unit 71 and the second terminal unit 72 may be rotatable relative to each other while rubbing against one another. In an embodiment, the first terminal unit 71 may be located on the first wireless communication module 610, and the second terminal unit 72 may be located on the second wireless communication module 620. In some embodiments, the first terminal unit 71 may be located on the third surface 61*a* of the first printed circuit board 61. In some embodiments, the second terminal unit 72 may be located on the fifth surface 62*a* of the second printed circuit board 62. In some embodiments, the first terminal unit 71 may be referred to by various other terms, such as a first contact, and the second terminal unit 72 may be referred to by various other terms, such as a second contact. In some embodiments, the first terminal unit 71 and the second terminal unit 72 may be collectively referred to as an electric conduction structure between the first printed circuit board 61 and the second printed circuit board 62. The electric conduction structure including the first terminal unit 71 and the second terminal unit 72 may contribute stable and durable electric conduction during the state change of the electronic device 2 compared to using an electric path such as a flexible printed circuit board.

According to an embodiment, the second terminal unit 72 may be implemented as a rotation terminal unit for reducing friction with the first terminal unit 71. The rotation terminal unit may include, for example, a conductive rolling member (e.g., various types of rollers such as balls) capable of rolling while rubbing against the first terminal unit 71. The rotation terminal unit may be implemented in various other ways to reduce frictional force with the first terminal unit 71 while maintaining electric conduction with the first terminal unit 71. In some embodiments, a conductive lubricant may be interposed between the first terminal unit 71 and the second terminal unit 72.

According to some embodiments, the first terminal unit 71 or the second terminal unit 72 may be implemented such that the first terminal unit 71 and the second terminal unit 72 can be in elastic contact. For example, the first terminal unit 71 may include an elastic member such as a spring that contributes to elastic contact with the second terminal unit 72.

According to an embodiment, a first power management circuit may be located on the first printed circuit board 61. The first power management circuit may include at least a portion of the power management module 188 of FIG. 1, and may include, for example, a power management integrated circuit (PMIC). The first power management circuit may distribute drive power required by the components of the electronic device 2 using the power of the battery 50. The first power management circuit may provide power to the display drive circuit (e.g., DDI), the sensor IC (e.g., touch controller IC), and the first wireless communication module 610, which are electrically connected to the first printed circuit board 61. The first power management circuit may provide power from the first printed circuit board 61 to the second printed circuit board 62 through electric conduction between the first terminal unit 71 and the second terminal unit 72. A second power management circuit may be located on the second printed circuit board 62. The second power management circuit may include at least a portion of the power management module 188 of FIG. 1, and may include, for example, a PMIC. The second power management circuit may distribute power to components (e.g., a processor, a memory, and a second wireless communication module 620) disposed on the second printed circuit board 62 and components (e.g., the third printed circuit board 63) electrically connected to the second printed circuit board 52 using the power provided from the first power management circuit.

According to an embodiment, the third printed circuit board 63 may be located between the battery 50 (or the cylindrical roller 40) and the second cover 212. The third printed circuit board 63 is disposed on the second cover 212 or a support member (not illustrated) coupled to the second cover 212 using various polymer adhesive materials or fastening means such as a bolt. In some embodiments, the cylindrical roller 40 may include a cover member that at least partially covers a second opening (not illustrated) located on the second cover 212 side, and the third printed circuit board 63 may be positioned between the second cover 212 and the cover member. The third printed circuit board 63 may include, for example, a PCB, an FPCB, or an RFPCB.

According to an embodiment, the electrical path 65 may electrically interconnect the first printed circuit board 61 and the third printed circuit board 63. An electrical path may extend to the space between the cylindrical roller 40 and the housing 20. The electrical path may include, for example, a flexible printed circuit board. The electronic device 2 may include various components (e.g., various components included in the electronic device 101 of FIG. 1, such as an input module, a sensor module, an antenna module, a camera module, or an interface) disposed on or electrically connected to the third printed circuit board 63. The first power management circuit located on the first printed circuit board 61 may provide power to the third printed circuit board 63.

According to an embodiment, the second printed circuit board 62 may include a first circuit board 6201 (e.g., a main PCB), a second circuit board 6202 (e.g., a slave PCB) disposed to partially overlap the first circuit substrate (e.g., first circuit board 6201), and an interposer substrate 6203. The interposer substrate 6203 may include a circuit or wiring electrically interconnecting the first circuit board 6201 and the second circuit board 6202. The second printed circuit board 62 including the interposer substrate 6203 may be referred to as, for example, an interposer printed circuit board. The first circuit board 6201 may define the fifth surface 62*a* of the second printed circuit board 62, and the second circuit board 6202 may define the sixth surface 62*b* of the second printed circuit board 62. The second wireless communication module 620 may be disposed on the first circuit board 6201. Various components, such as a processor (e.g., the processor 120 in FIG. 1), a memory (e.g., the memory 130 in FIG. 1), or a power management module (e.g., the power management module 188 in FIG. 1), may be disposed on the second circuit board 6202. The interposer printed circuit boards may contribute to space utilization. In some embodiments, the third printed circuit board 63 may be implemented as an interposer printed circuit board.

According to an embodiment, the electronic device 2 may include a display support structure disposed on or coupled to the rear surface of the flexible display 30. The rear surface of the flexible display 30 may refer to a surface located opposite to the surface from which light from a display panel including a plurality of pixels is emitted. The display support structure may contribute to enabling the flexible display 30 to move while maintaining a smoothly connected shape, for example, during the state change of the electronic device 2 (e.g., switching between the closed state in FIG. 2 and the open state in FIG. 3). In an embodiment, the display support structure may include a multi-bar structure (or a multi-bar assembly). The multi-bar structure may include, for example, a form in which a plurality of support bars extending in a direction in which the rotation axis C extends (e.g., the y-axis direction) are arranged. The multi-bar structure may have flexibility due to portions having a relatively small thickness among the plurality of support bars. In some embodiments, the multi-bar structure may be implemented without connecting portions connecting the plurality of support bars. In some embodiments, the multi-bar structure may be referred to by various other terms, such as a flexible track.

According to some embodiments, the electronic device 2 may include a rail unit for guiding the movement of the display support structure. The rail unit may include, for example, a first guide rail 1 provided on the first cover 211 or a support member disposed on the first cover 211 or a second guide rail provided on the second cover 212 or a support member disposed on the second cover 212. One side portion of the display support structure may be located on or inserted into the first guide rail, and the other side portion of the display support structure may be located on or inserted into the second guide rail. The first guide rail and the second guide rail may include grooves or recesses corresponding to a movement path of the display support structure. The display support structure may be moved while being guided by the first guide rail and the second guide rail.

According to some embodiments, the electronic device 2 may further include a support sheet disposed on or coupled to the rear surface of the flexible display 30. In this case, the display support structure (e.g., the multi-bar structure) may be disposed on the support sheet. The support sheet may contribute to the durability of the flexible display 30. The support sheet may reduce the influence of a load or stress that may occur during the state change of the electronic device 2 (e.g., switching between the closed state in FIG. 2 and the open state in FIG. 3), on the flexible display 30. The support sheet may prevent the flexible display 30 from being damaged by a force to move the flexible display 30. The support sheet may include a lattice structure. The lattice structure may include, for example, a plurality of openings (or slits). For example, the plurality of openings may be provided periodically, may have substantially the same shape, and may be repeatedly arranged at regular intervals. The lattice structure may contribute to flexibility of the flexible display 30. In some embodiments, the support sheet may include a recess pattern (not illustrated) including a plurality of recesses in place of the lattice structure. In some embodiments, the support sheet including a lattice structure or a recess pattern, or a conductive member corresponding thereto, may be configured in a plurality of layers.

Figure 9:
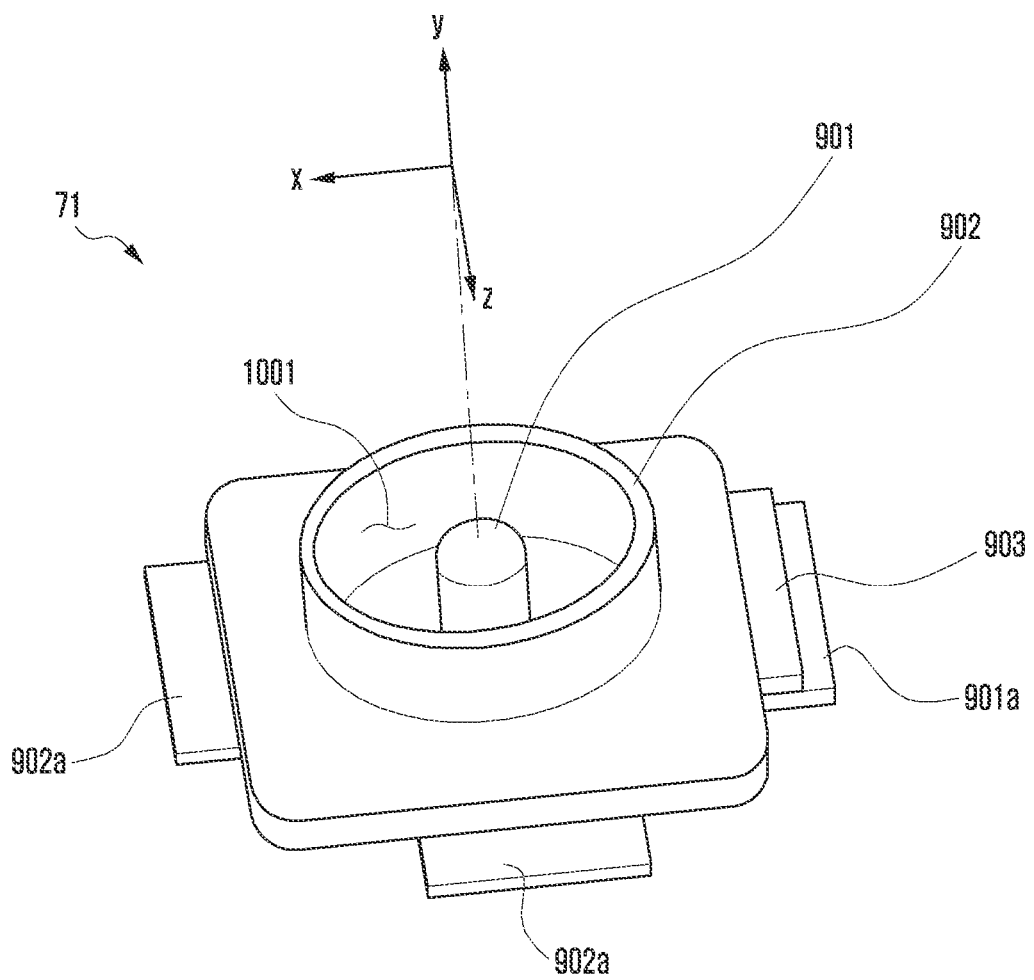
FIG. 9 illustrates a first terminal unit of FIG. 8 according to an embodiment of the disclosure.

FIG. 9 illustrates a first terminal unit of FIG. 8 according to an embodiment of the disclosure.

Figure 10:
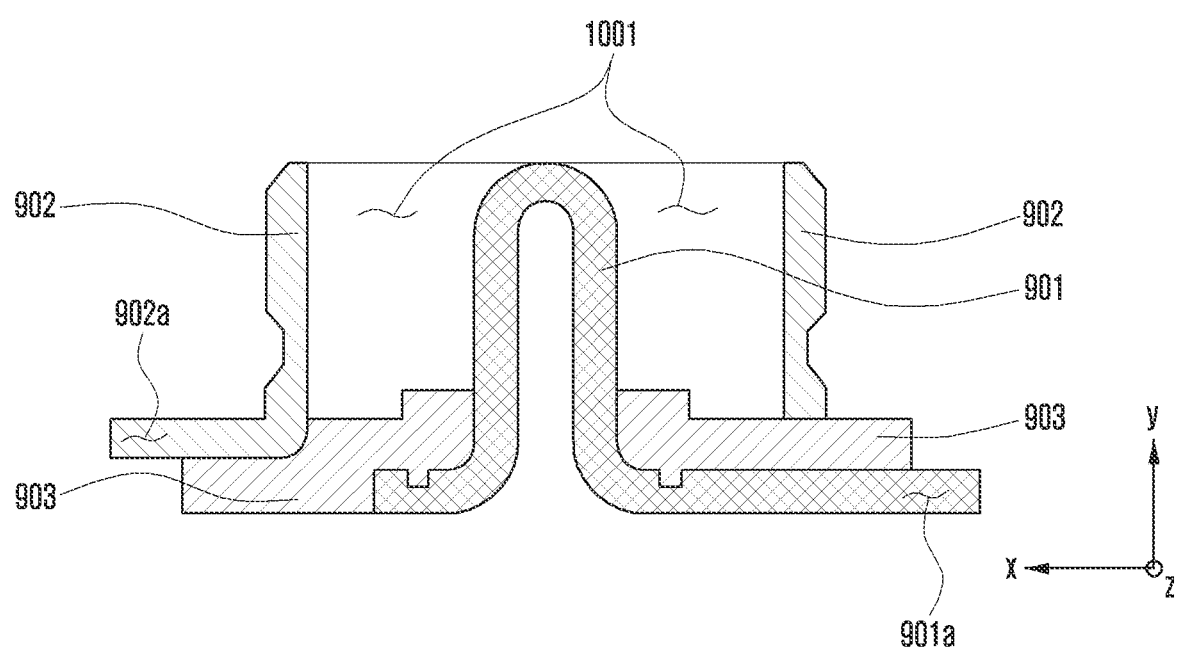
FIG. 10 is, for example, a cross-sectional view in an x-y plane of a first terminal unit in FIG. 9 according to an embodiment of the disclosure.

FIG. 10 is, for example, a cross-sectional view in an x-y plane of a first terminal unit in FIG. 9 according to an embodiment of the disclosure.

Figure 11:
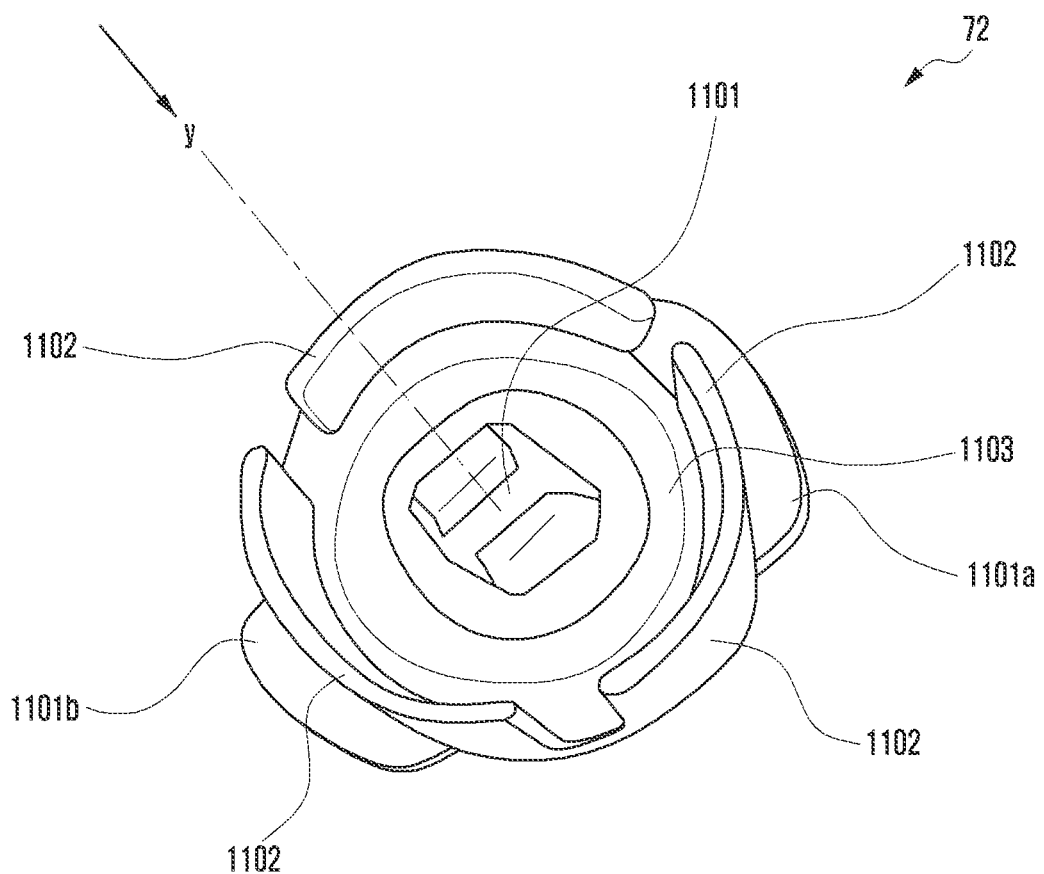
FIG. 11 illustrates a second terminal unit of FIG. 8 according to an embodiment of the disclosure.

FIG. 11 illustrates a second terminal unit of FIG. 8 according to an embodiment of the disclosure.

Referring to FIGS. 9 and 10, a first terminal unit 71 may include a first terminal 901, a second terminal 902, and/or a support unit 903. The first terminal 901 and the second terminal 902 may be disposed on the insulating support unit 903 and may be physically separated from each other with the support unit 903 interposed therebetween. The first terminal 901 may be provided in the form of a round bar protruding relative to the support unit 903 toward the second terminal unit 72 (see FIG. 8) (e.g., in the +y-axis direction), and the second terminal 902 may be provided in a form of surrounding the first terminal 901 with a separating space 1001 interposed therebetween. The first terminal 901 may include at least one first extension 901a extending in a direction orthogonal to the y-axis direction (e.g., the x-axis direction or the z-axis direction) from the support unit 903 side. The second terminal 902 may include at least one second extension 902a extending from the support unit 903 side in a direction orthogonal to the y-axis direction. The at least one first extension 901a and the at least one second extension 902a may be disposed on the first wireless communication module 610 of FIG. 8 using a conductive bonding material (e.g., solder). The first terminal 901 may be electrically connected to the first printed circuit board 61 (see FIG. 8) via the first wireless communication module 610.

Referring to FIG. 11, a second terminal unit 72 may include a third terminal 1101, a fourth terminal 1102, and a support unit 1103. The third terminal 1101 and the fourth terminal 1102 may be disposed on the insulative support unit 1103 and may be physically separated from each other with the support unit 1103 interposed therebetween. The third terminal 1101 may have a structure into which the first terminal 901 (see FIGS. 9 and 10) can be inserted. When the first terminal unit 71 (see FIGS. 9 and 10) and the second terminal unit 72 are connected to each other, the first terminal 901 may be inserted into the third terminal 1101 and may come into rotatable contact with the third terminal 1101. When the first terminal unit 71 and the second terminal unit 72 are connected to each other, the fourth terminal 1102 may be inserted into the space 1001 (see FIGS. 9 and 11) of the first terminal unit 71 to come into rotatable contact with the second terminal 902 (see FIGS. 9 and 11). The third terminal 1101 may include at least one third extension 1101a extending from the support unit 1103 side in a direction orthogonal to the y-axis direction. The fourth terminal 1102 may include at least one fourth extension 1101b extending from the support unit 1103 side in a direction orthogonal to the y-axis direction. The at least one third extension 1101a and the at least one fourth extension 1101b may be disposed on the second wireless communication module 620 of FIG. 8 using a conductive bonding material (e.g., solder). The second terminal 902 may be electrically connected to the second printed circuit board 62 (see FIG. 8) via the second wireless communication module 620.

Although not illustrated, the first terminal unit 71 and the second terminal unit 72 may be implemented in various other forms to be rotatable relative to each other while rubbing against each other during the state change of the electronic device 2 (e.g., switching between the closed state in FIG. 2 and the open state in FIG. 3).

Figure 12:
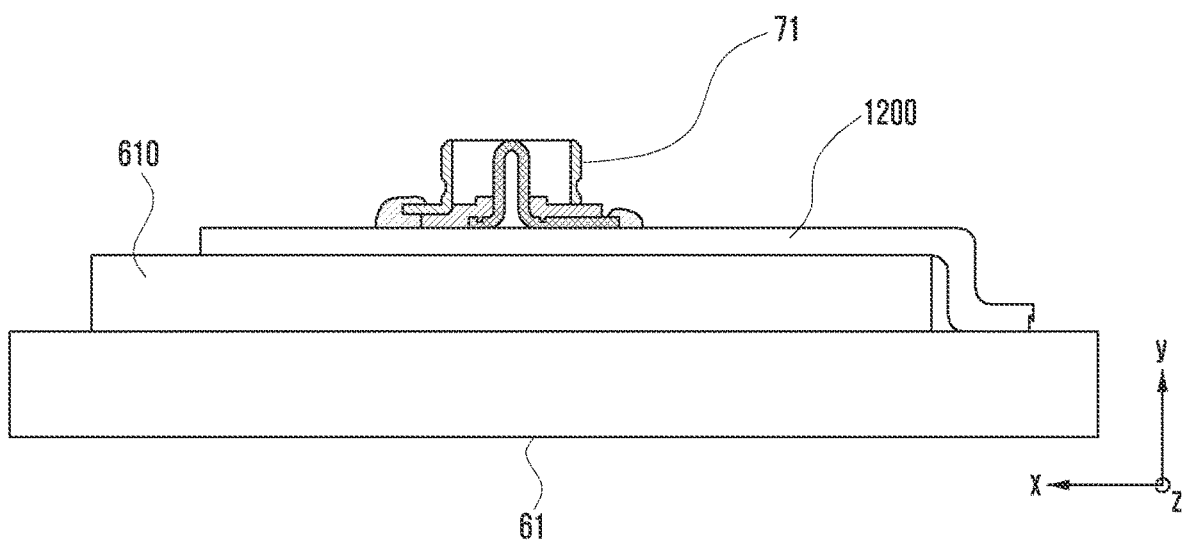
FIG. 12 is a cross-sectional view illustrating a first terminal unit, a first wireless communication module, and a flexible printed circuit board according to an embodiment of the disclosure.

FIG. 12 is a cross-sectional view of a first terminal unit, a first wireless communication module, a flexible printed circuit board, or a first printed circuit board according to an embodiment of the disclosure.

Referring to FIG. 12, a first terminal unit 71 may be disposed on a first wireless communication module 610 using a flexible printed circuit board 1200, unlike the embodiment of FIG. 8. The first terminal unit 71 may be disposed on the flexible printed circuit board 1200, and the flexible printed circuit board 1200 may electrically interconnect the first terminal unit 71 and the first printed circuit board 61.

According to some embodiments, the second terminal unit 72 (see FIG. 7) may be electrically connected to the second printed circuit board 62 (see FIG. 7) via a flexible printed circuit board substantially in the same manner of electrically connecting the first terminal unit 71 to the first printed circuit board 61 via the flexible printed circuit board 1200.

Figure 13:
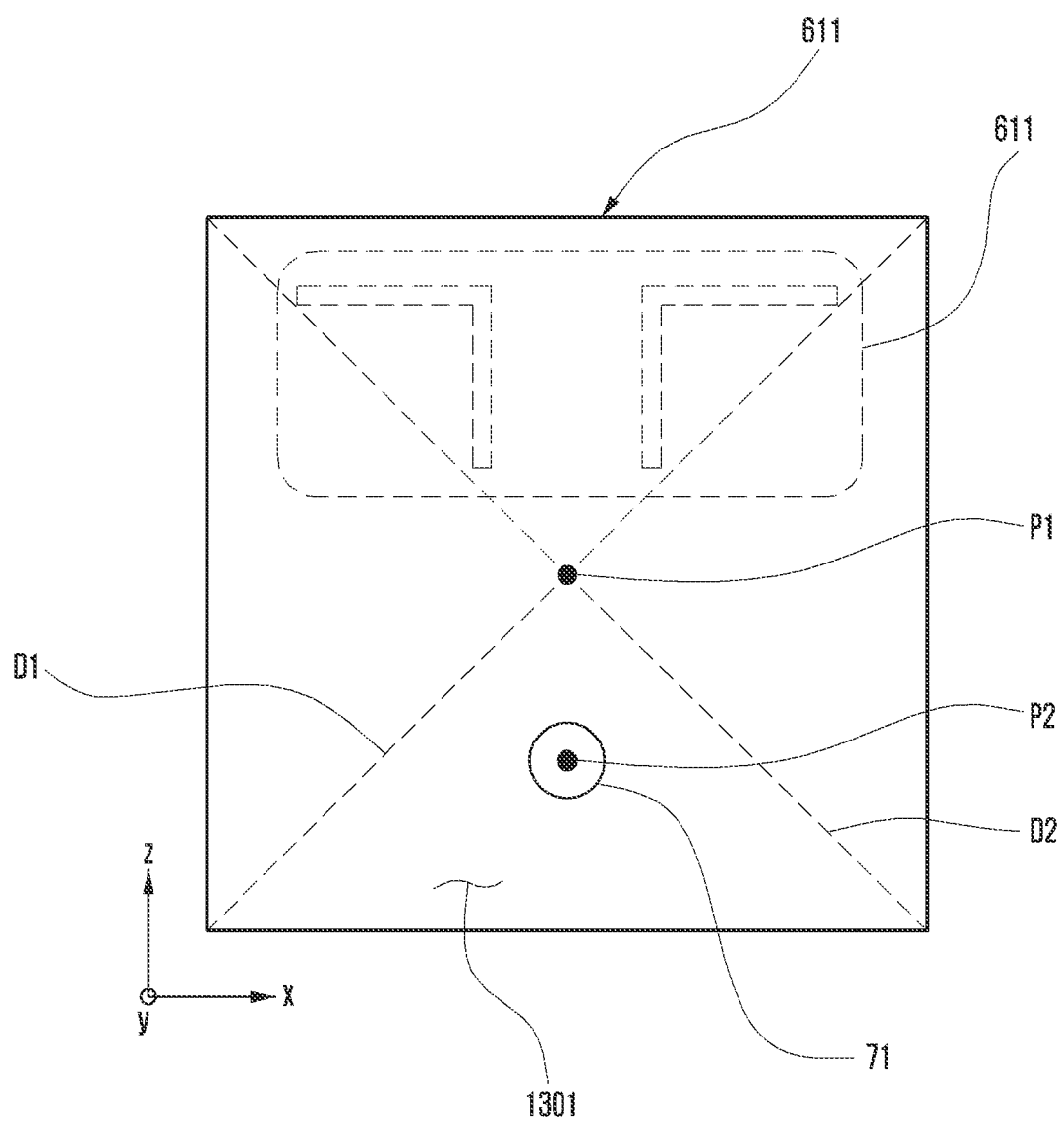
FIG. 13 is a plan view illustrating a first wireless communication module and a first terminal unit according to an embodiment of the disclosure.

FIG. 13 is a plan view illustrating a first wireless communication module 600 and a first terminal unit 71 according to an embodiment of the disclosure.

Referring to FIG. 13, one surface 1301 (e.g., a surface facing a second wireless communication module 620 in FIG. 8) of a first wireless communication module 610 on which a first terminal unit 71 is disposed may have a rectangular or square shape. Compared to the embodiment of FIG. 5 in which the first terminal unit 71 is located at the center P1 of the rectangular surface 1301, in the embodiment of FIG. 13, the first terminal unit 71 may be disposed at a position P2 spaced apart from the center P1 of the rectangular surface 1301. The center P1 of the rectangular surface 1301 may correspond to an intersection position of diagonals D1 and D2. The rotation axis C in FIG. 2 or 3 may be located to correspond to the position P2. The position at which the first terminal unit 71 is disposed is not limited to the embodiment of FIG. 13 and may vary. Although not illustrated, the second terminal unit 72 of FIG. 8 may be disposed on the second wireless communication module 620 of FIG. 8 in the same manner as the embodiment of FIG. 13.

Figure 14:
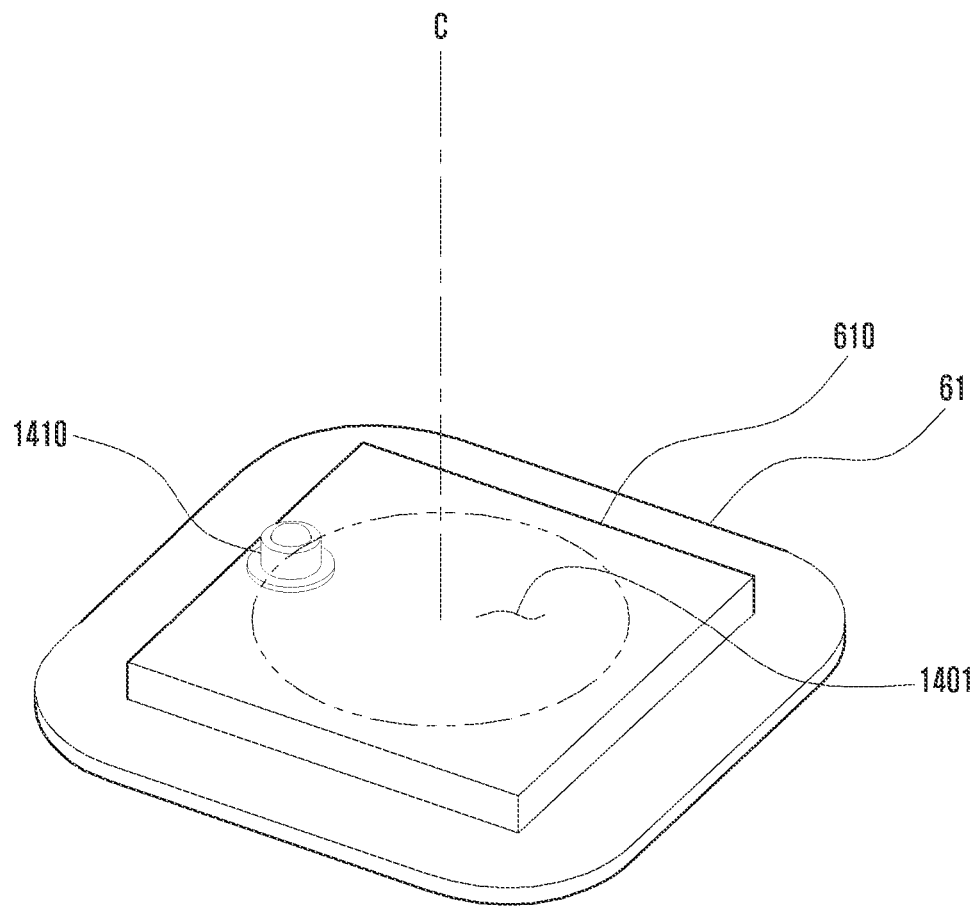
FIG. 14 illustrates a first printed circuit board including a first wireless communication module, and a first terminal unit, according to an embodiment of the disclosure.

FIG. 14 illustrates a first printed circuit board including a first wireless communication module, and a first terminal unit, according to an embodiment of the disclosure.

Figure 15:
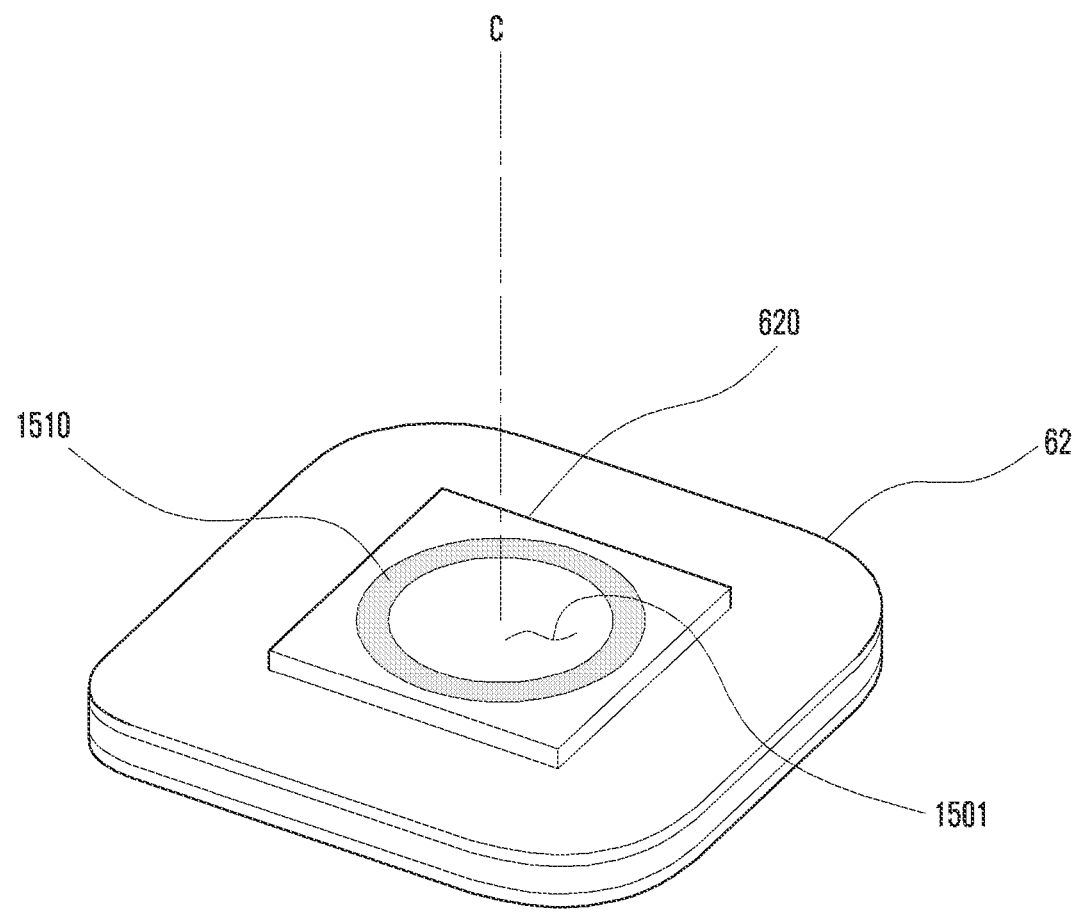
FIG. 15 illustrates a second printed circuit board including a second wireless communication module, and a second terminal unit, according to an embodiment of the disclosure.

FIG. 15 illustrates a second printed circuit board including a second wireless communication module, and a second terminal unit, according to an embodiment of the disclosure.

Referring to FIGS. 14 and 15, a first terminal unit 1410 may be located on a first wireless communication module 610 to be spaced apart from a rotation axis C. The second terminal unit 1510 may be located on the second wireless communication module 620 to be spaced apart from the rotation axis C. As illustrated, the second terminal unit 1510 may be provided in the form of a ring around the rotation axis C so that electric conduction with the first terminal unit 1410 can be maintained during the state change (e.g., switching between the closed state in FIG. 2 and the open state in FIG. 3) of the electronic device 2. The number of first terminal units 1410 is not limited to the illustrated example and may vary.

According to an embodiment, at least one first antenna radiator located on the first wireless communication module 610 and at least one second antenna radiator located on the second wireless communication module 620 may be aligned to correspond to the rotation axis C. For example, the at least one second antenna radiator may be located in the second area 1501 of the second wireless communication module 620 surrounded by the second terminal unit 1510. The at least one first antenna radiator may be located in the first area 1401 of the first wireless communication module 610 that faces the second area 1501.

Figure 16:
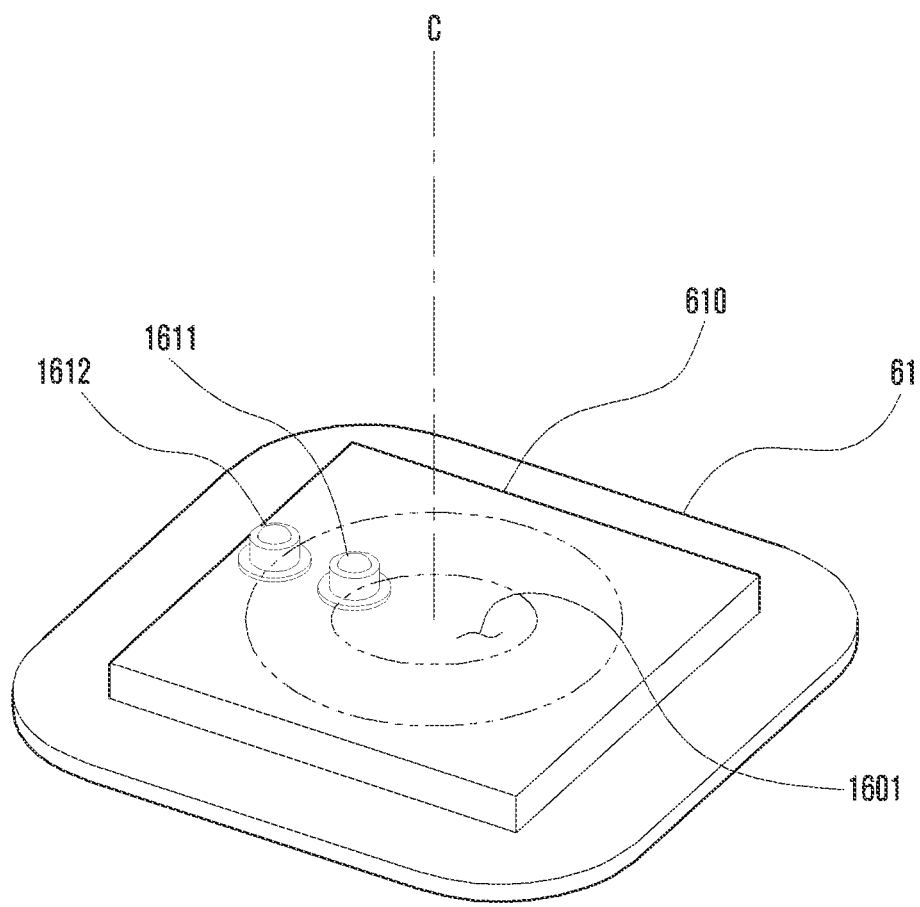
FIG. 16 illustrates a first printed circuit board including a first wireless communication module, and a plurality of first terminal units, according to an embodiment of the disclosure.

FIG. 16 illustrates a first printed circuit board including a first wireless communication module, and a plurality of first terminal units, according to an embodiment of the disclosure.

Figure 17:
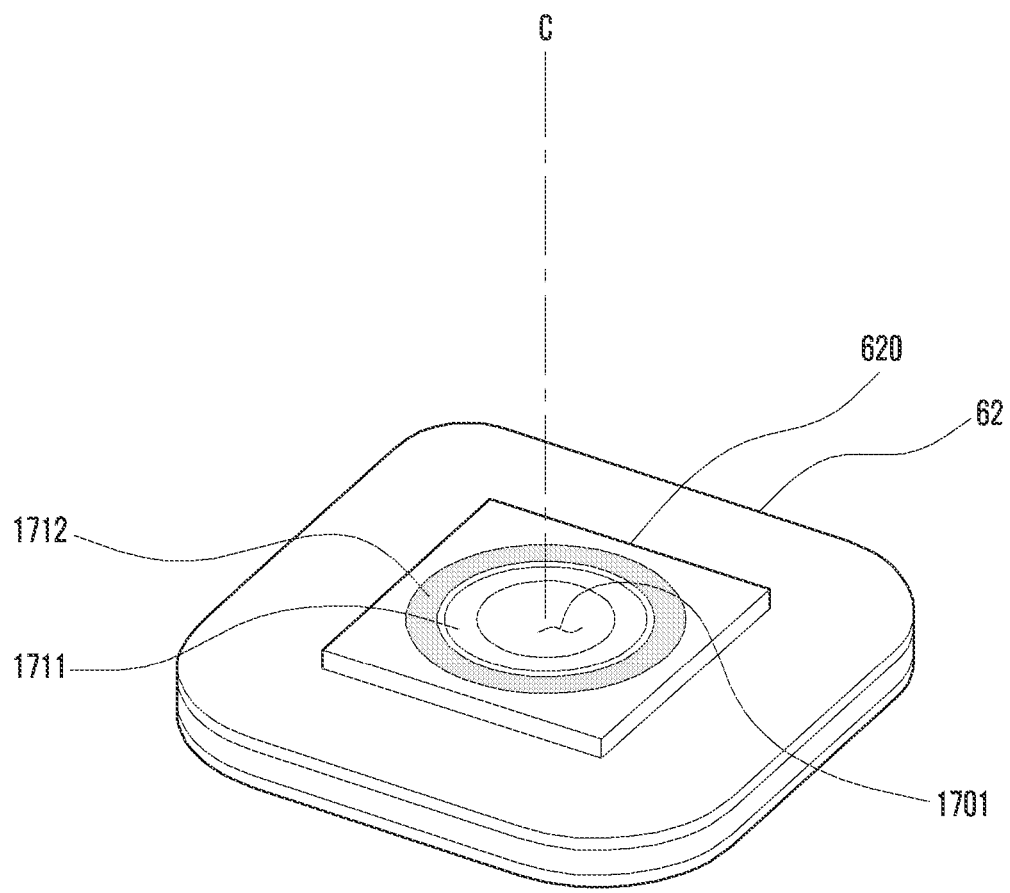
FIG. 17 illustrates a second printed circuit board including a second wireless communication module, and a plurality of second terminal units, according to an embodiment of the disclosure.

FIG. 17 illustrates a second printed circuit board including a second wireless communication module, and a plurality of second terminal units, according to an embodiment of the disclosure.

Referring to FIGS. 16 and 17, one first terminal unit 1611 may be located on a first wireless communication module 610 to be spaced apart from a rotation axis C by a first distance. The other first terminal unit 1612 may be located on the first wireless communication module 610 to be spaced apart from the rotation axis C by a second distance greater than the first distance. As illustrated, one second terminal unit 1711 may be provided in the form of a ring around the rotation axis C so that electric conduction with one first terminal unit 1611 can be maintained during the state change (e.g., switching between the closed state in FIG. 2 and the open state in FIG. 3) of the electronic device 2. As illustrated, the other second terminal unit 1712 may be provided in the form of a ring around the rotation axis C so that electric conduction with the other first terminal unit 1612 can be maintained during the state change of the electronic device 2. The number of first terminal units spaced apart from the rotation axis C by the first distance is not limited to the illustrated example and may vary. The number of first terminal units spaced apart from the rotation axis C by the second distance is not limited to the illustrated example and may vary. Although not illustrated, at least one first terminal unit located to be spaced apart from the rotation axis C by a distance different from the first distance and the second distance and a second terminal unit corresponding to the first terminal unit may be implemented.

According to an embodiment, at least one first antenna radiator located on the first wireless communication module 610 and at least one second antenna radiator located on the second wireless communication module 620 may be aligned to correspond to the rotation axis C. For example, the at least one second antenna radiator may be located in the second area 1701 of the second wireless communication module 620 surrounded by the second terminal unit 1711. The at least one first antenna radiator may be located in the first area 1601 of the first wireless communication module 610 that faces the second area 1701.

Figure 18:
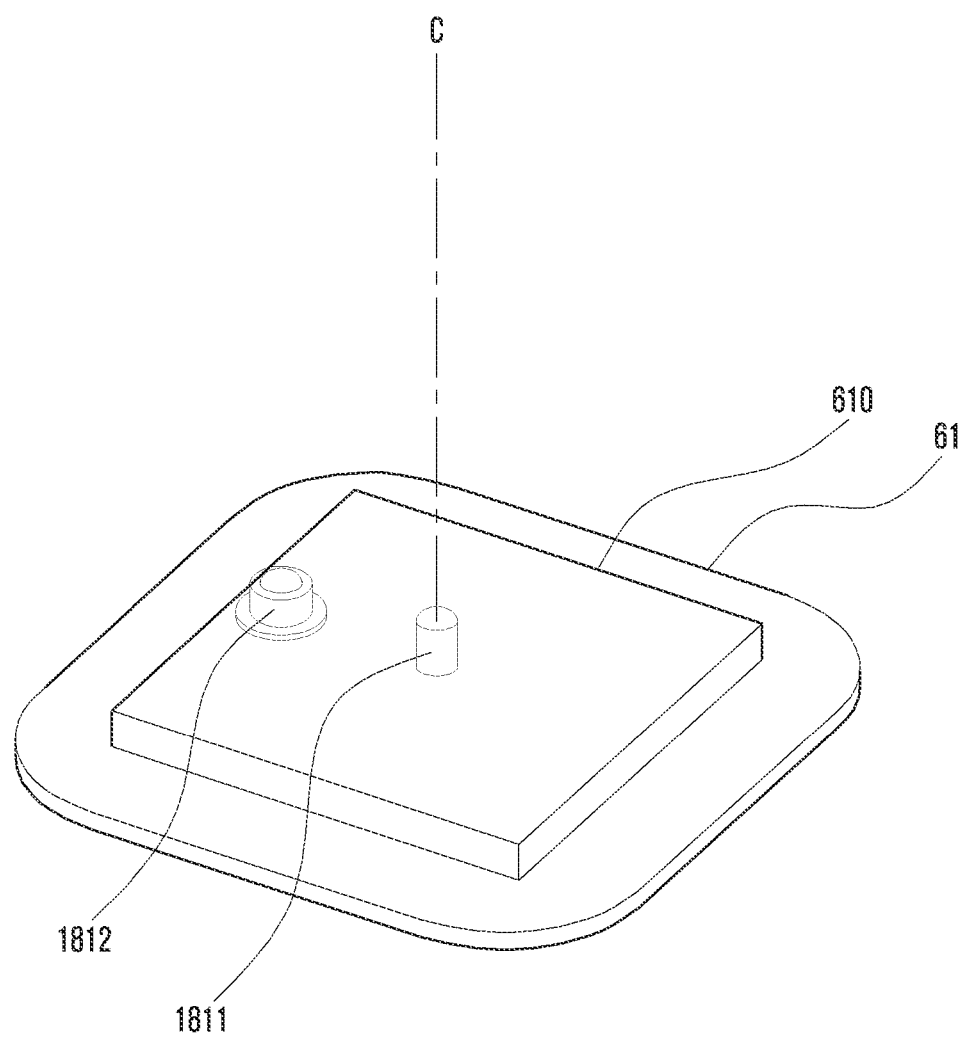
FIG. 18 illustrates a first printed circuit board including a first wireless communication module, and a plurality of first terminal units, according to an embodiment of the disclosure.

FIG. 18 illustrates a first printed circuit board including a first wireless communication module, and a plurality of first terminal units, according to an embodiment of the disclosure.

Figure 19:
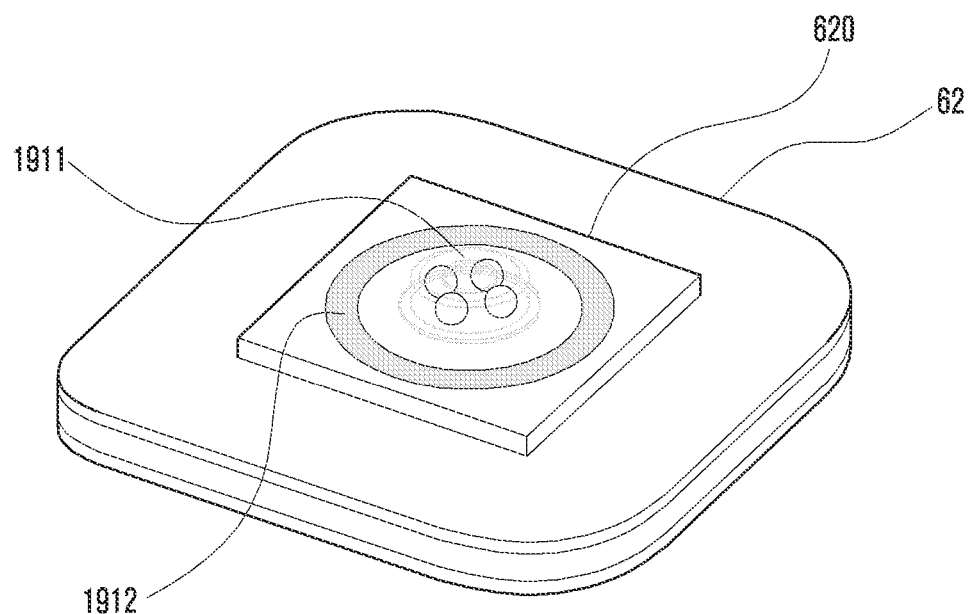
FIG. 19 illustrates a second printed circuit board including a second wireless communication module, and a plurality of second terminal units, according to an embodiment of the disclosure.

FIG. 19 illustrates a second printed circuit board including a second wireless communication module, and a plurality of second terminal units, according to an embodiment of the disclosure.

Referring to FIGS. 18 and 19, one first terminal unit 1811 may be located on a first wireless communication module 610 to correspond to a rotation axis C. The other first terminal unit 1812 may be located on the first wireless communication module 610 to be spaced apart from the rotation axis C. One second terminal unit 1911 may include a rotation terminal unit and may include, for example, a conductive rolling member (e.g., various types of rollers such as balls) capable of rolling while rubbing against one first terminal unit 1811. The rotation terminal unit may be implemented in various other ways. As illustrated, the other second terminal unit 1912 may be provided in the form of a ring around the rotation axis C so that electric conduction with the other first terminal unit 1812 can be maintained during the state change (e.g., switching between the closed state in FIG. 2 and the open state in FIG. 3) of the electronic device 2. The number of first terminal units spaced apart from the rotation axis C is not limited to the illustrated example and may vary.

Figure 20:
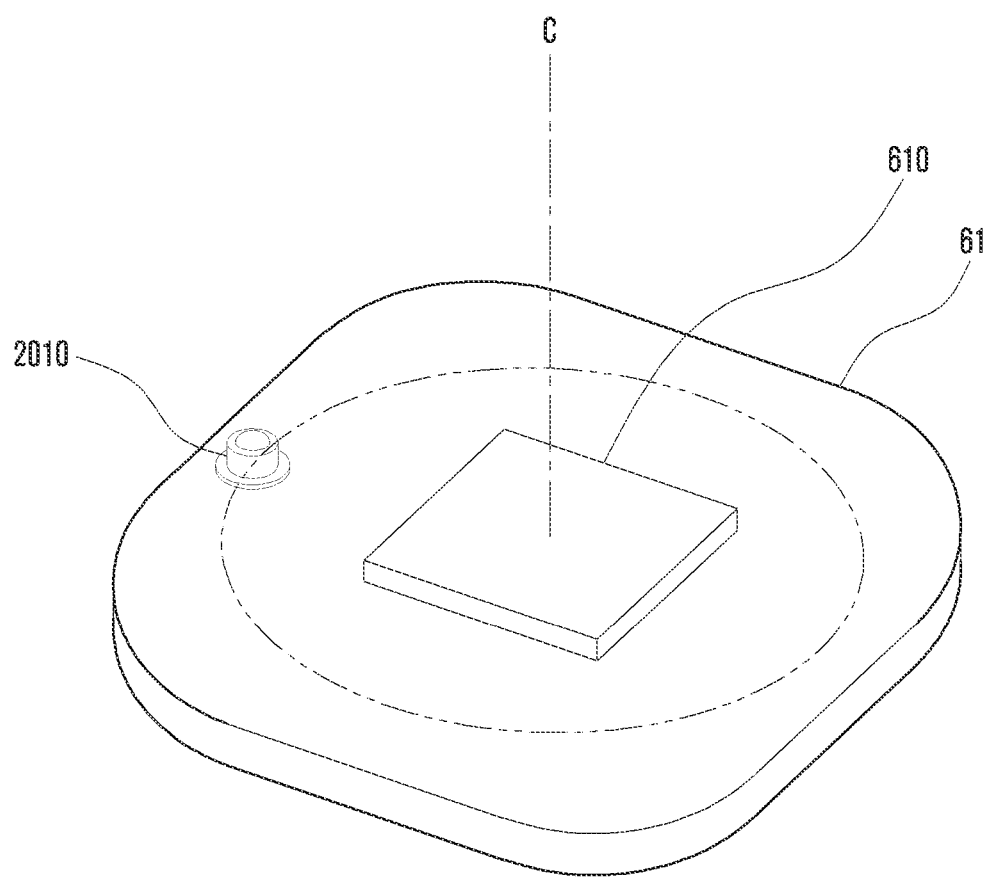
FIG. 20 illustrates a first printed circuit board including a first wireless communication module, and at least one first terminal unit, according to an embodiment of the disclosure.

FIG. 20 illustrates a first printed circuit board including a first wireless communication module, and at least one first terminal unit, according to an embodiment of the disclosure.

Figure 21:
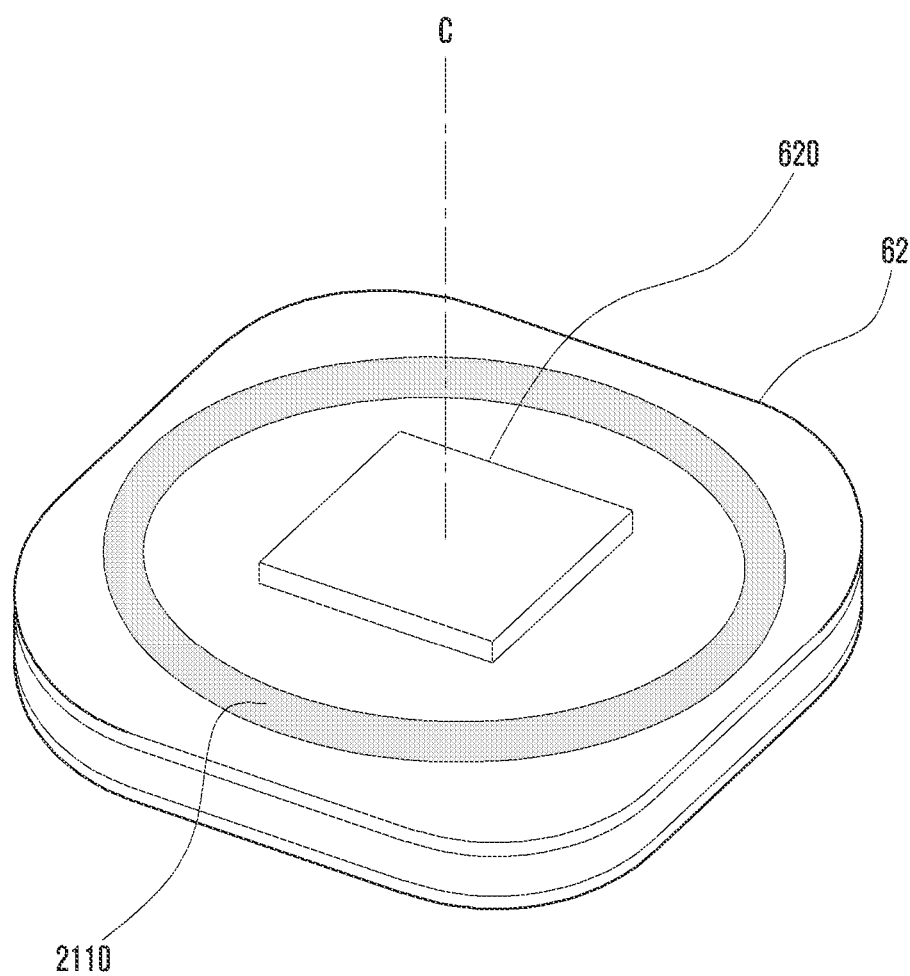
FIG. 21 illustrates a second printed circuit board including a second wireless communication module, and a second terminal unit, according to an embodiment of the disclosure.

FIG. 21 illustrates a second printed circuit board including a second wireless communication module, and a second terminal unit, according to an embodiment of the disclosure.

Referring to FIGS. 20 and 21, at least one first terminal unit 2010 may be located on a first printed circuit board 61 around a first wireless communication module 610 to be spaced apart from a rotation axis C. The second terminal unit 2110 may be located on the second printed circuit board 62 around the second wireless communication module 620 to be spaced apart from the rotation axis C. As illustrated, the second terminal unit 2110 may be provided in the form of a ring around the rotation axis C so that electric conduction with the at least one first terminal unit 2010 can be maintained during the state change (e.g., switching between the closed state in FIG. 2 and the open state in FIG. 3) of the electronic device 2. The number of first terminal units 2010 is not limited to the illustrated example and may vary.

According to an embodiment, at least one first antenna radiator located on the first wireless communication module 610 and at least one second antenna radiator located on the second wireless communication module 620 may be aligned to correspond to the rotation axis C.

According to some embodiments, the at least one first antenna radiator may be located in an area of the first printed circuit board 61 that does not overlap the first wireless communication module 610. The at least one second antenna radiator may be located in an area of the second printed circuit board 62 that does not overlap the second wireless communication module 620.

Figure 22:
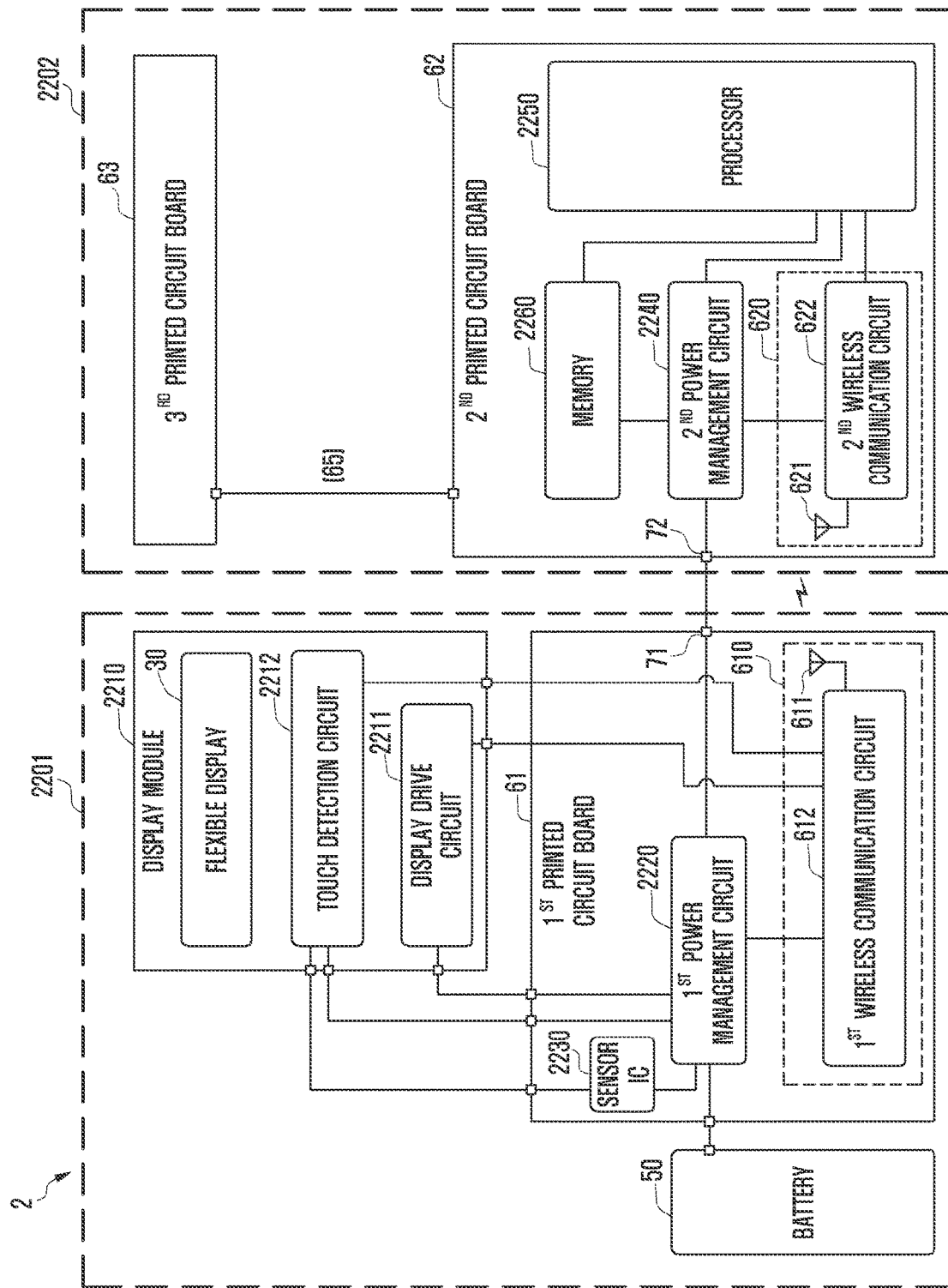
FIG. 22 is a block diagram of the electronic device of FIG. 2 according to an embodiment of the disclosure.

FIG. 22 is a block diagram of an electronic device of FIG. 2 according to an embodiment of the disclosure.

Referring to FIG. 22, in an embodiment, an electronic device 2 may include a moving unit 2201 and a non-moving unit 2202. The moving unit 2201 may refer to a part that moves within the housing 20 of FIG. 2 during the state change of the electronic device 2 (e.g., the closed state in FIG. 2 and the open state in FIG. 3). The non-moving unit 2202 may indicate a part that does not move in the housing 20 of FIG. 2 during the stage change of the electronic device 2. The moving unit 2201 may include, for example, a display module 2210, the cylindrical roller 40 of FIG. 4, a battery 50, a first printed circuit board 61, and a first terminal unit 71. The non-moving unit (or a fixed unit) 2202 may include, for example, a second printed circuit board 62, a third printed circuit board 63, an electrical path 65, and a second terminal unit 72.

According to an embodiment, a first wireless communication module 610, a first terminal unit 71, a first power management circuit 2220, and a sensor IC 2230 may be located on the first printed circuit board 61. The first wireless communication module 610 may include at least one first antenna radiator 611 and a first wireless communication circuit 612 electrically connected to the at least one first antenna radiator 611. A second wireless communication module 620, a second terminal unit 72, a second power management circuit 2240, a processor 2250 (e.g., the processor 120 in FIG. 1), and a memory 2260 (e.g., the memory 130 in FIG. 1) may be located on the second printed circuit board 62. The second wireless communication module 620 may include at least one second antenna radiator 621 and a second wireless communication circuit 622 electrically connected to the at least one second antenna radiator 621. The electronic device 2 may be the electronic device 101 of FIG. 1, or may be implemented by including at least some of the components of the electronic device 101 of FIG. 1 or by additionally including other components. According to some embodiments, the electronic device 2 may be implemented by omitting some of the components of the electronic device 101 of FIG. 1.

According to an embodiment, the first wireless communication circuit 612 and the second wireless communication circuit 622 may exchange signals in at least one predetermined frequency band using, for example, the at least one first antenna radiator 611 and the at least one second antenna radiator 621.

According to an embodiment, the first printed circuit board 61 and the second printed circuit board 62 may be electrically connected via electric conduction between the first terminal unit 71 and the second terminal unit 72.

According to an embodiment, the first power management circuit 2220 (e.g., at least a portion of the power management module 188 of FIG. 1) may distribute driving power required by the components of the electronic device 2 using the power of the battery 50. For example, the first power management circuit 2220 may provide power to the display drive circuit 2211 of the display module 2210, the sensor IC 2230, and the first wireless communication module 610. For example, the first power management circuit 2220 may provide power from the first printed circuit board 61 to the second printed circuit board 62 through electric conduction between the first terminal unit 71 and the second terminal unit 72. In some embodiments, the first wireless communication module 610 may be implemented to include the first power management circuit 2220.

According to an embodiment, the second power management circuit 2240 (e.g., at least a portion of the power management module 188 of FIG. 1) may distribute power to components disposed on the second printed circuit board 62 (e.g., the processor 2250, the memory 2260, and the second wireless communication module 620) and components electrically connected to the second printed circuit board 62 (e.g., the third printed circuit board 63 electrically connected to the second printed circuit board 62 via the electrical path 65) using the power provided from the first power management circuit 2220. In some embodiments, the second wireless communication module 620 may be implemented to include the second power management circuit 2240.

According to an embodiment, the display module 2210 (e.g., the display module 160 in FIG. 1) may include a flexible display 30, a display drive circuit 2211, or a touch detection circuit 2212.

The display drive circuit 2211 is a circuit for controlling the flexible display 30 and may include, for example, a DDI or a DDI chip. In an embodiment, the display drive circuit 2211 may include a touch display driver IC (TDDI) disposed in a chip on panel (COP) or chip on film (COF) manner A signal commanded by the processor 2250 may be transmitted to the display drive circuit 2211 through wireless communication between the first wireless communication module 610 and the second wireless communication module 620. The display drive circuit 2211 may serve as a signal path between the flexible display 30 and the processor 2250 to control pixels via TFTs in the flexible display 30. For example, the display drive circuit 2211 has a function of turning on or off pixels included in the flexible display 30 and may be electrically connected to the gate electrodes of the TFTs. The display drive circuit 2211 has a function of adjusting the amount of red, green, and blue (RGB) signals of the pixels so as to make a color difference, and may be electrically connected to the source electrodes of the TFTs. Each TFT may include a gate line electrically connecting the display drive circuit 2211 to a gate electrode of the TFT and a source line (or a data line) electrically connecting the display drive circuit to the source electrode of the TFT. According to various embodiments, the display drive circuit 2211 may operate in response to a red, green, blue, white (RGBW) scheme in which a white pixel is added to RGB pixels. In some embodiments, the display drive circuit 2211 may be a DDI package. The DDI package may include a DDI (or a DDI chip), a timing controller (T-CON), a graphic RAM (GRAM), or a power generating circuit. In some embodiments, the graphic RAM may be omitted, or a memory provided separately from the display drive circuit 2211 may be used. The timing controller may convert a data signal input from the processor 2250 into a signal required by the DDI. The timing controller may serve to adjust input data information into signals suitable for a gate driver (or a gate IC) and a source driver (or a source IC) of the DDI. The graphic RAM may serve as a memory that temporarily stores data to be input to the driver (or IC) of the DDI. The graphic RAM may store an input signal and send the signal back to the driver of the DDI, and at this time, the RAM may interact with the timing controller to process the signal. The power generating circuit may generate a voltage for driving the flexible display 30 to supply a required voltage to the gate driver and the source driver of the DDI.

The touch detection circuit 2212 may include, for example, a transmitter (Tx) including a plurality of first electrode lines (or a plurality of driving electrodes), and a receiver (Rx) including a plurality of second electrode lines (or a plurality of receiving electrodes). In an embodiment, the sensor IC 2230 may supply current (e.g., alternating current) to the touch detection circuit 2212, and an electric field may be formed between the transmitter and the receiver of the touch detection circuit 2212. The sensor IC 2230 may convert an analog signal acquired via the touch detection circuit 2212 into a digital signal. For example, when a finger touches the screen (see the screen S in FIG. 3) or reaches within a threshold distance from the screen, a change in the electric field may occur, and a change in capacitance (or a voltage drop) related thereto may occur. When the change in capacitance is equal to or greater than a threshold value, the sensor IC 2230 may generate an electrical signal regarding coordinates on the screen as a valid touch input or a hovering input and provide the electrical signal to the first wireless communication module 610. The electrical signal regarding the coordinates on the screen may be transmitted to the processor 710 through wireless communication between the first wireless communication module 610 and the second wireless communication module 620. The processor 2250 may recognize the coordinates on the screen based on the electrical signal from the sensor IC 2230. In some embodiments, the flexible display 30 may be implemented to include a touch detection circuit 2212. In some embodiments, the electrical signal from the sensor IC 2230 may be transmitted to the processor 2250 via a separate electrical path (e.g., a flexible printed circuit board or a cable) that electrically interconnects the first printed circuit board 61 and the second printed circuit board 62.

The sensor IC 2230 may include, for example, a touch controller integrated circuit (IC). The touch controller IC may perform various functions such as noise filtering, noise removal, and sensing data extraction in relation to the touch detection circuit 2212. According to various embodiments, the touch controller IC may include various circuits such as an analog-digital converter (ADC), a digital signal processor (DSP), and/or a micro control unit (MCU).

The processor 2250 may include, for example, a micro controller unit (MCU), and may control a plurality of hardware components connected to the processor 2250 in a wired or wireless manner by driving an operating system (OS) or an embedded software program. The processor 2250 may control the plurality of hardware components according to, for example, instructions (e.g., the program 140 in FIG. 1) stored in the memory 2260.

According to some embodiments, the first wireless communication module 610 and the second wireless communication module 620 may be implemented to transmit or receive power wirelessly. In this case, the first terminal unit 71 and the second terminal unit 72 may be omitted. For example, the power distributed from the first power management circuit 2220 may be supplied to the second power management circuit 2240 through wireless communication (e.g., wireless power transmission/reception) between the first wireless communication module 610 and the second wireless communication module 620.

For example, the first wireless communication module 610 and the second wireless communication module 620 may include an electromagnetic induction type power transmission/reception circuit. The at least one first antenna radiator 611 included in the first wireless communication module 610 may include a first coil, and the at least one second antenna radiator 621 included in the second wireless communication module 620 may include a second coil. When the magnetic field flowing in the first coil is applied to the second coil, induced current flows in the second coil, and the second power management circuit 2240 may provide power to a load that is disposed on the second printed circuit board 62 or electrically connected to the second printed circuit board 62 using this induced current. In an embodiment, the electromagnetic induction type power transmission/reception circuit may comply with a wireless power consortium (WPC) standard. The electromagnetic induction type power transmission/reception circuit according to the WPC standard may transmit or receive power wirelessly using a frequency of about 110 kHz to about 205 kHz. According to some embodiments, the electromagnetic induction type power transmission/reception circuit may comply with a power matter alliance (PMA) standard. The electromagnetic induction power transmission/reception circuit according to the PMA standard may transmit or receive power wirelessly using a frequency of about 227 kHz to about 357 kHz or about 118 kHz to about 153 kHz.

According to some embodiments, the power transmission/reception circuit may be an electromagnetic resonance type power transmission/reception circuit. For example, the at least one first antenna radiator 611 (e.g., the first coil) and the at least one second antenna radiator 621 (e.g., the second coil) may have the same resonant frequency, and the second wireless communication module 620 may receive power wirelessly from the first wireless communication module 610 using a resonance phenomenon between the first and second antenna radiators. For example, the electromagnetic resonance type power transmission/reception circuit may comply with an alliance for wireless power (A4WP) standard. The electromagnetic resonance type power transmission/reception circuit according to the A4WP standard may transmit or receive power wirelessly using a resonance frequency of about 6.78 MHz.

According to an embodiment of the disclosure, an electronic device (e.g., the electronic device 2 in FIG. 2) may include a housing (e.g., the housing 20 in FIG. 2), and a flexible display (e.g., the flexible display 30 in FIG. 3) configured to be at least partially rolled in a substantially circular shape around a rotation axis (the rotation axis C in FIG. 2) in an internal space of the housing. The electronic device may include a battery (e.g., the battery 50) located in a space in which the flexible display is rolled. The electronic device may include a first printed circuit board (e.g., the first printed circuit board 61 in FIG. 4) located on one surface of the battery that is oriented in the direction of the rotation axis. The first printed circuit board may be electrically connected to the flexible display and may include a first wireless communication circuitry (or a first wireless communication module) (e.g., the first wireless communication module 610 in FIG. 4). The electronic device may include a second printed circuit board (e.g., the second printed circuit board 62 in FIG. 4) located inside the housing to face the first printed circuit board. The second printed circuit board may include a second wireless communication circuitry (or a second wireless communication module) (e.g., the second wireless communication module 620 in FIG. 8). The first printed circuit board may be rotatable about the rotation axis in the state of being electrically connected to the second printed circuit board.

According to an embodiment of the disclosure, the first printed circuit board (e.g., the first printed circuit board 61 in FIG. 8) may include a first terminal circuitry (or a first terminal unit) (e.g., the first terminal unit 71 of FIG. 8). The second printed circuit board (e.g., the second printed circuit board 62 in FIG. 8) may include a second terminal circuitry (or a second terminal unit) (e.g., the second terminal unit 72 in FIG. 8) electrically connected to the first terminal circuitry. The first terminal circuitry and the second terminal circuitry may be in rotatable contact with each other.

According to an embodiment of the disclosure, the first terminal circuitry (e.g., the first terminal unit 71 in FIG. 8) and the second terminal circuitry (e.g., the second terminal unit 72 in FIG. 8) may be aligned to the rotation axis (e.g., the rotation axis C in FIG. 8).

According to an embodiment of the disclosure, the second terminal circuitry (see, e.g., the embodiment of FIG. 19) may include a conductive rolling member configured to be rollable while rubbing against the first terminal circuitry.

According to an embodiment of the disclosure, the first terminal circuitry (e.g., the first terminal unit 71 in FIG. 8) may be in elastic contact with the second terminal circuitry (e.g., the second terminal unit 72 of FIG. 8).

According to an embodiment of the disclosure, the first terminal circuitry may be located apart from the rotation axis (see, e.g., the embodiment of FIG. 13, 14, or 16).

According to an embodiment of the disclosure, the first terminal circuitry (e.g., the first terminal unit 71 in FIG. 8) may be located on the first wireless communication circuitry (e.g., the first wireless communication module 610 in FIG. 8), and the second terminal circuitry (e.g., the second terminal unit 72 in FIG. 8) may be located on the second wireless communication circuitry (e.g., the second wireless communication module 620 in FIG. 8).

According to an embodiment of the disclosure, the electronic device may further include a flexible printed circuit board (e.g., the flexible printed circuit board 1200 of FIG. 12) electrically connected to the first terminal circuitry (e.g., the first terminal unit 71 in FIG. 12) and the first printed circuit board (e.g., the first printed circuit board 61 of FIG. 12).

According to an embodiment of the disclosure, the first printed circuit board (e.g., the first printed circuit board 61 in FIG. 8) may be electrically connected to the battery (e.g., the battery 50 in FIG. 8). The power of the battery may be provided from the first printed circuit board (e.g., the first printed circuit board 61 in FIG. 8) to the second printed circuit board (e.g., the second printed circuit board 62 in FIG. 8) through electric conduction between the first terminal circuitry (e.g., the first terminal unit 71 in FIG. 8) and the second terminal circuitry (e.g., the second terminal unit 72 in FIG. 8).

According to an embodiment of the disclosure, the first printed circuit board (e.g., the first printed circuit board 61 in FIG. 22) may further include a power management circuit (e.g., the first power management circuit 2220 in FIG. 22). The power management circuit may provide power to the flexible display (e.g., the flexible display 30 in FIG. 22) and the second printed circuit board (e.g., the second printed circuit board 62 in FIG. 22) using the battery (e.g., the battery 50 in FIG. 22).

According to an embodiment of the disclosure, the second printed circuit board (e.g., the second printed circuit board 62 in FIG. 22) may further include another power management circuit (e.g., the second power management circuit 2240 of FIG. 22) configured to provide drive power to electronic components disposed on the second printed circuit using power provided from the power management circuit (e.g., the first power management circuit 2220 in FIG. 22) included in the first printed circuit board.

According to an embodiment of the disclosure, the first wireless communication circuitry (e.g., the first wireless communication module 610 in FIG. 22) may include at least one first antenna radiator (e.g., at least one first antenna radiator 611 in FIG. 22) and a first wireless communication circuit (e.g., the first wireless communication circuit 612 in FIG. 22) electrically connected to the at least one first antenna radiator. The second wireless communication circuitry (e.g., the second wireless communication module 620 in FIG. 22) may include at least one second antenna radiator (e.g., at least one second antenna radiator 621 in FIG. 22) and a second wireless communication circuit (e.g., the second wireless communication circuit 622 in FIG. 22) electrically connected to the at least one second antenna radiator. The first wireless communication circuit and the second wireless communication circuit may exchange signals of at least one frequency in a selected or predetermined frequency band.

According to an embodiment of the disclosure, the first antenna radiator and the second antenna radiator may be aligned to correspond to the rotation axis (e.g., the rotation axis C in FIG. 8).

According to an embodiment of the disclosure, the first antenna radiator or the second antenna radiator may be located apart from the rotation axis (e.g., the rotation axis C in FIG. 8).

According to an embodiment of the disclosure, through wireless communication between the first wireless communication circuitry (e.g., the first wireless communication module 610 in FIG. 22) and the second wireless communication circuitry (e.g., the second wireless communication module 620 in FIG. 22), a signal regarding the flexible display (e.g., the flexible display 30 in FIG. 22) may be provided from the second printed circuit board (e.g., the second printed circuit board 62 in FIG. 22) to the first printed circuit board (e.g., the first printed circuit board 61 in FIG. 22).

According to an embodiment of the disclosure, the battery (e.g., the battery 50 in FIG. 8) may be rotated about the rotation axis (e.g., the rotation axis C in FIG. 8) together with the first printed circuit board (e.g., the first printed circuit board 61 in FIG. 8).

According to an embodiment of the disclosure, the electronic device may further include a cylindrical roller (e.g., the cylindrical roller 40 in FIG. 4) located in the space in which the flexible display (e.g., the flexible display 30 of FIG. 4) is rolled. The battery may be located in an internal space of the cylindrical roller.

According to an embodiment of the disclosure, the second printed circuit board (e.g., the second printed circuit board 62 in FIG. 8) may include an interposer substrate.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a housing;
   a flexible display configured to be at least partially rolled around a rotation axis in a substantially circular shape in an internal space of the housing;
   a battery located in the internal space in which the flexible display is rolled;
   a first printed circuit board located on one surface of the battery that is oriented in a direction of the rotation axis, the first printed circuit board being electrically connected to the flexible display and including a first wireless communication circuitry; and
   a second printed circuit board located inside the housing to face the first printed circuit board and including a second wireless communication circuitry,
   wherein the first printed circuit board is configured to be rotatable about the rotation axis in a state of being electrically connected to the second printed circuit board.

2. The electronic device of claim 1,
   wherein the first printed circuit board comprises a first terminal circuitry,
   wherein the second printed circuit board comprises a second terminal circuitry electrically connected to the first terminal circuitry, and
   wherein the first terminal circuitry and the second terminal circuitry are in rotatable contact with each other.

3. The electronic device of claim 2, wherein the first terminal circuitry and the second terminal circuitry are aligned with the rotation axis.

4. The electronic device of claim 3, wherein the second terminal circuitry comprises a conductive rolling member configured to be rollable while rubbing against the first terminal circuitry.

5. The electronic device of claim 2, wherein the first terminal circuitry is in elastic contact with the second terminal circuitry.

6. The electronic device of claim 2, wherein the first terminal circuitry is located apart from the rotation axis.

7. The electronic device of claim 2,
   wherein the first terminal circuitry is located on the first wireless communication circuitry, and wherein the second terminal circuitry is located on the second wireless communication circuitry.

8. The electronic device of claim 2, further comprising:
a flexible printed circuit board electrically connected to the first terminal circuitry and the first printed circuit board.

9. The electronic device of claim 2,
wherein the first printed circuit board is electrically connected to the battery, and
wherein power of the battery is provided from the first printed circuit board to the second printed circuit board through electric conduction between the first terminal circuitry and the second terminal circuitry.

10. The electronic device of claim 9,
wherein the first printed circuit board further comprises a power management circuit, and
wherein the power management circuit provides power to the flexible display and the second printed circuit board using the battery.

11. The electronic device of claim 10, wherein the second printed circuit board comprises another power management circuit configured to provide drive power to electronic components disposed on the second printed circuit board using the power provided from the power management circuit included in the first printed circuit board.

12. The electronic device of claim 1,
wherein the first wireless communication circuitry comprises at least one first antenna radiator, and a first wireless communication circuit electrically connected to the at least one first antenna radiator,
wherein the second wireless communication circuitry comprises at least one second antenna radiator, and a second wireless communication circuit electrically connected to the at least one second antenna radiator, and
wherein the first wireless communication circuit and the second wireless communication circuit are configured to exchange signals of at least one frequency in a selected or predetermined frequency band.

13. The electronic device of claim 12, wherein the first antenna radiator and the second antenna radiator are aligned with respect to the rotation axis.

14. The electronic device of claim 12, wherein the first antenna radiator or the second antenna radiator is located apart from the rotation axis.

15. The electronic device of claim 1, wherein a signal regarding the flexible display is provided from the second printed circuit board to the first printed circuit board through wireless communication between the first wireless communication circuitry and the second wireless communication circuitry.

16. The electronic device of claim 1, wherein the battery is configured to be rotated about the rotation axis together with the first printed circuit board.

17. The electronic device of claim 1, further comprising:
a cylindrical roller located in the internal space in which the flexible display is rolled,
wherein the battery is located in the internal space of the cylindrical roller.

18. The electronic device of claim 1, wherein the second printed circuit board comprises an interposer substrate.

* * * * *